US010224234B2

(12) United States Patent
Okamoto

(10) Patent No.: US 10,224,234 B2
(45) Date of Patent: Mar. 5, 2019

(54) SEMICONDUCTOR DEVICE, MANUFACTURING METHOD THEREOF, SOLID-STATE IMAGING DEVICE, AND ELECTRONIC APPARATUS

(71) Applicant: Sony Corporation, Tokyo (JP)

(72) Inventor: Masaki Okamoto, Kumamoto (JP)

(73) Assignee: Sony Corporation, Tokyo (JP)

( * ) Notice: Subject to any disclaimer, the term of this patent is extended or adjusted under 35 U.S.C. 154(b) by 17 days.

(21) Appl. No.: 15/584,827

(22) Filed: May 2, 2017

(65) Prior Publication Data
US 2017/0236745 A1 Aug. 17, 2017

Related U.S. Application Data

(63) Continuation of application No. 15/084,939, filed on Mar. 30, 2016, now Pat. No. 9,754,990, which is a (Continued)

(30) Foreign Application Priority Data

Apr. 19, 2011 (JP) .................................. 2011-093035

(51) Int. Cl.
*H01L 23/48* (2006.01)
*H01L 21/768* (2006.01)
(Continued)

(52) U.S. Cl.
CPC .. *H01L 21/76804* (2013.01); *H01L 21/76831* (2013.01); *H01L 21/76877* (2013.01);
(Continued)

(58) Field of Classification Search
CPC ............................................... H01L 21/76804
See application file for complete search history.

(56) References Cited

U.S. PATENT DOCUMENTS

| 7,544,973 B2 * | 6/2009 | Wada ................ H01L 21/76898 257/432 |
| 8,269,315 B2 * | 9/2012 | Tanida .............. H01L 21/76898 257/621 |
| 2003/0022475 A1 * | 1/2003 | Vieux-Rochaz ........................... H01L 21/76898 438/598 |

FOREIGN PATENT DOCUMENTS

| KR | 10-2004-0058765 | 7/2004 |
| KR | 10-2006-0050151 | 5/2006 |
| KR | 10-2010-0105380 | 9/2010 |

OTHER PUBLICATIONS

Official Action (with English translation) for Korean Patent Application No. 10-2012-0028599, dated Apr. 17, 2018, 19 pages.

* cited by examiner

Primary Examiner — Ajay K Arora
(74) Attorney, Agent, or Firm — Sheridan Ross P.C.

(57) ABSTRACT

A method of manufacturing a semiconductor device includes bonding a first semiconductor wafer including a first substrate and a first insulating layer formed to contact one surface of the first substrate, and a second semiconductor wafer including a second substrate and a second insulating layer, forming a third insulating layer, performing etching so that the second insulating layer remains on a second wiring layer, forming a first connection hole, forming an insulating film on the first connection hole, performing etching of the second insulating layer and the insulating film, forming a second connection hole, and forming a first via formed in inner portions of the connection holes and connected to the second wiring layer, wherein a diameter of the first connection hole formed on the other surface of the first substrate is greater than a diameter of the first connection hole formed on the third insulating layer.

6 Claims, 14 Drawing Sheets

Related U.S. Application Data continuation of application No. 14/954,493, filed on Nov. 30, 2015, now Pat. No. 9,431,448, which is a continuation of application No. 13/444,050, filed on Apr. 11, 2012, now Pat. No. 9,236,412.

(51) Int. Cl.
*H01L 27/146* (2006.01)
*H04N 5/378* (2011.01)
*H01L 23/522* (2006.01)
*H01L 23/00* (2006.01)

(52) U.S. Cl.
CPC ...... *H01L 21/76898* (2013.01); *H01L 23/481* (2013.01); *H01L 23/5226* (2013.01); *H01L 24/27* (2013.01); *H01L 27/1464* (2013.01); *H01L 27/1469* (2013.01); *H01L 27/14627* (2013.01); *H01L 27/14632* (2013.01); *H01L 27/14634* (2013.01); *H01L 27/14636* (2013.01); *H01L 27/14643* (2013.01); *H01L 27/14689* (2013.01); *H04N 5/378* (2013.01); *H01L 2224/24145* (2013.01); *H01L 2224/2919* (2013.01); *H01L 2224/32145* (2013.01); *H01L 2224/9205* (2013.01); *H01L 2224/92244* (2013.01); *H01L 2224/94* (2013.01); *H01L 2225/06544* (2013.01); *H01L 2924/0715* (2013.01); *H01L 2924/13091* (2013.01); *H01L 2924/1431* (2013.01)

SEMICONDUCTOR DEVICE, MANUFACTURING METHOD THEREOF, SOLID-STATE IMAGING DEVICE, AND ELECTRONIC APPARATUS

CROSS-REFERENCE TO RELATED APPLICATIONS

This application is a continuation of U.S. patent application Ser. No. 15/084,939, filed Mar. 30, 2016, which is a continuation of U.S. patent application Ser. No. 14/954,493, filed Nov. 30, 2015, now U.S. Pat. No. 9,431,448, which is a continuation of U.S. patent application Ser. No. 13/444,050, filed Apr. 11, 2012, now U.S. Pat. No. 9,236,412, which claims priority to Japanese Patent Application No. JP 2011-093035, filed Apr. 19, 2011, the entire disclosures of which are hereby incorporated herein by reference.

BACKGROUND

The present disclosure relates to a semiconductor device, a manufacturing method thereof, a solid-state imaging device, and an electronic apparatus.

In the related art, in order to achieve high density of a semiconductor device or hybridization of semiconductor circuits having different functions, a method which laminates a plurality of semiconductor wafers mounted on the semiconductor circuits is suggested. In order to connect semiconductor circuits of the laminated semiconductor wafers to each other, for example, as disclosed in Japanese Unexamined Patent Application Publication No. 2006-181641, there is a method which connects contacts of electronic components to each other by using soldering or a method which directly connects the contacts to each other without the soldering.

In addition, other than the methods, for example, as disclosed in Japanese Unexamined Patent Application Publication No. 2010-245506, there is a method which electrically connects the semiconductor circuits to each other by using a via. In Japanese Unexamined Patent Application Publication No. 2010-245506, a first semiconductor wafer on which a pixel array or a control circuit is mounted and a second semiconductor wafer on which a logic circuit is mounted are connected to each other through the via. When the circuits of the laminated semiconductor wafers are connected to each other through the via, an insulating film is formed on an inner wall surface of a connection hole in order to electrically insulate between the via and a semiconductor substrate. Specifically, after the insulating film is formed on the connection hole, the insulating film of portions other than the inner wall surface of the connection hole is removed by etching, a wiring is exposed, and thereafter, the via is formed.

SUMMARY

As disclosed in Japanese Unexamined Patent Application Publication No. 2010-245506, when a plurality of vias having different depths are formed, the film thicknesses of the insulating films which are formed on the bottom portions of the connection holes are different from one another according to the depths of the vias due to coverage dependence of the formation amount of the insulating films. If the insulating films having different film thicknesses are etched, the insulating film having the thinner film thickness is over-etched, and there is a problem in that a wiring under the insulating film is exposed to the etching for extended periods.

In addition, when the insulating film of the bottom portion of the connection hole is removed by etching back, there is a problem in that an opening portion of the connection hole is etched and the substrate is exposed.

Therefore, it is desirable to provide a semiconductor device, a manufacturing method thereof, a solid-state imaging device, and an electronic apparatus capable of connecting circuits of laminated semiconductor wafers while suppressing influence on a substrate or a wiring due to etching when a via is formed.

According to an embodiment of the present disclosure, there is provided a method of manufacturing a semiconductor device including: bonding a first semiconductor wafer including a first substrate and a first insulating layer which is formed so as to come into contact with one surface of the first substrate, and a second semiconductor wafer including a second substrate and a second insulating layer which is formed so as to come into contact with one surface of the second substrate to each other; forming a third insulating layer on the other surface of a side opposite to the one surface of the first substrate; penetrating the third insulating layer, the first substrate, and the first insulating layer, performing etching so that the second insulating layer remains on a second wiring layer which is formed in the second insulating layer, and forming a first connection hole; forming an insulating film on the first connection hole; performing etching of the second insulating layer on the second wiring layer and the insulating film, forming a second connection hole, and exposing the second wiring layer; and forming a first via which is formed in inner portions of the first and the second connection holes and is connected to the second wiring layer, wherein a diameter of the first connection hole which is formed on the other surface of the first substrate is greater than a diameter of the first connection hole which is formed on the third insulating layer.

Since the diameter of the first connection hole which is formed on the other surface of the first substrate is greater than the diameter of the first connection hole which is formed on the third insulating layer, even when the etching of the second insulating layer on the second wiring layer and the insulating film is preformed, the third insulating layer becomes a mask, the insulating film formed on the inner wall surface of the first connection hole is not easily etched, and the first substrate is not easily exposed. Therefore, the first substrate is not easily exposed to the etching.

According to another embodiment of the present disclosure, there is provided a semiconductor device in which a first semiconductor wafer including a first substrate and a first insulating layer which is formed so as to come into contact with one surface of the substrate, and a second semiconductor wafer including a second substrate and a second insulating layer which is formed so as to come into contact with one surface of the second substrate are bonded to each other, including: a third insulating layer which is formed on the other surface of a side opposite to the one surface of the first substrate; a first insulating film which is formed on a side wall of a portion of the first substrate, the first insulating layer, and the second insulating layer in an inner side of a first connection hole which penetrates the third insulating layer, the first substrate, and the first insulating layer and is formed on a portion of the second insulating layer; and a first via which is formed in an inner side of the first connection hole on which the first insulating film is formed and in an inner side of a second connection hole which is formed so that a second wiring layer formed on the second insulating layer is exposed, and is connected to the second wiring layer, wherein a diameter of the first connection hole which is formed on the other surface of the first substrate is greater than a diameter of the first connection hole which is formed on the third insulating layer.

According to still another embodiment of the present disclosure, there is provided a solid-state imaging device in which the first semiconductor wafer of the semiconductor device includes a pixel array portion.

According to still another embodiment of the present disclosure, there is provided an electronic apparatus including the solid-state imaging device, an optical lens, and a signal processing circuit.

According to the embodiments of the present disclosure, it is possible to connect circuits of the laminated semiconductor wafers while suppressing the influence on the substrate or the wiring due to etching when the via is formed.

DETAILED DESCRIPTION OF EMBODIMENTS

First Embodiment

Figure 1:
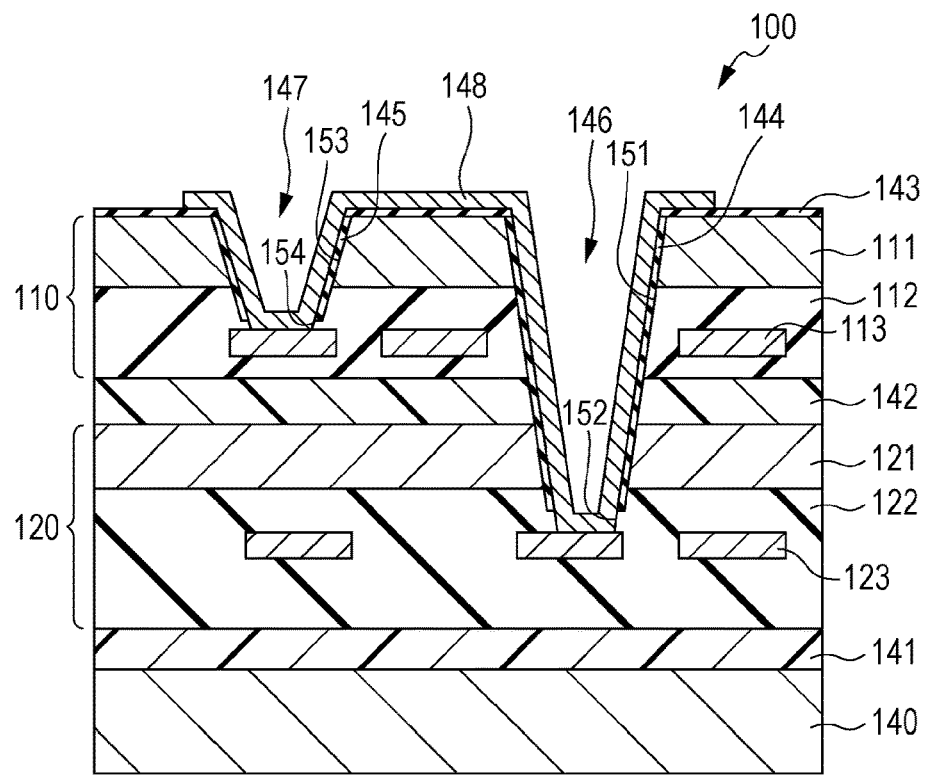
FIG. 1 is a view showing a semiconductor device according to a first embodiment.

FIG. 1 is a view showing a semiconductor device 100 according to a first embodiment. The semiconductor device 100 includes a first semiconductor wafer 110 and a second semiconductor wafer 120 which is bonded to the first semiconductor wafer 110.

The first semiconductor wafer 110 includes a first substrate 111, a first insulating layer 112 which is formed so as to come into contact with one surface of the first substrate 111, and a first wiring 113 which is formed in the first insulating layer 112. For example, the first substrate 111 is formed of silicon. For example, the first wiring 113 is formed of a metal such as copper.

The second semiconductor wafer 120 includes a second substrate 121, a second insulating layer 122 which is formed so as to come into contact with one surface of the second substrate 121, and a second wiring 123 which is formed in the second insulating layer 122. For example, the second substrate is 121 formed of silicon. For example, the second wiring 123 is formed of a metal such as copper.

For example, the semiconductor device 100 includes a supporting substrate 140 which is formed of silicon. The second insulating layer 122 of the second semiconductor wafer 120 is laminated on one surface of the supporting substrate 140 through a first connection layer 141. The first insulating layer 112 of the first semiconductor wafer 110 is laminated on the other surface, which is substantially parallel to the one surface of the second substrate 121 of the second semiconductor wafer 120, through a second connection layer 142. For example, the first and the second connection layers 141 and 142 are formed of a siloxane-based resin film. A third insulating layer 143 is formed on the other surface which is substantially parallel to the one surface of the first substrate 111 of the first semiconductor wafer 110.

The first wiring 113 of the first semiconductor wafer 110 and the second wiring 123 of the second semiconductor wafer 120 are connected to each other by the a first via 146, a second via 147, and a connecting wiring 148.

For example, the first via 146 is a metal such as copper which is formed in inner sides of a first connection hole 151 and a second connection hole 152. The first connection hole 151 penetrates the third insulating layer 143, the first substrate 111, the first insulating layer 112, the second connection layer 142, and the second substrate, and is formed up to the middle of the second insulating layer 122. The second connection hole 152 bores the second insulating layer 122 and is formed so that the second wiring 123 is exposed. The first connection hole 151 extends to the second insulating layer 122 side, and the second connection hole 152 is formed. A central axis of the second connection hole 152 is substantially the same as that of the first connection hole 151.

In the first connection hole 151, a first insulating film 144 is formed on the inner wall surface of the first connection hole 151 which is formed on the first substrate 111, the first insulating layer 112, the second connection layer 142, the second substrate 121, and the second insulating layer 122. In FIG. 1, the first insulating film 144 is not formed on the first connection hole 151 which is formed on the third insulating layer 143 and the second connection hole 152. That is, the first insulating film 144 and the first via 146 are formed on the inner wall surface of the first connection hole 151. The first via 146 is formed on the inner wall surface of the second connection hole 152. Moreover, according to a size of the second connection hole 152, there is a case where the second connection hole 152 is embedded by the first via 146.

Figure 9:
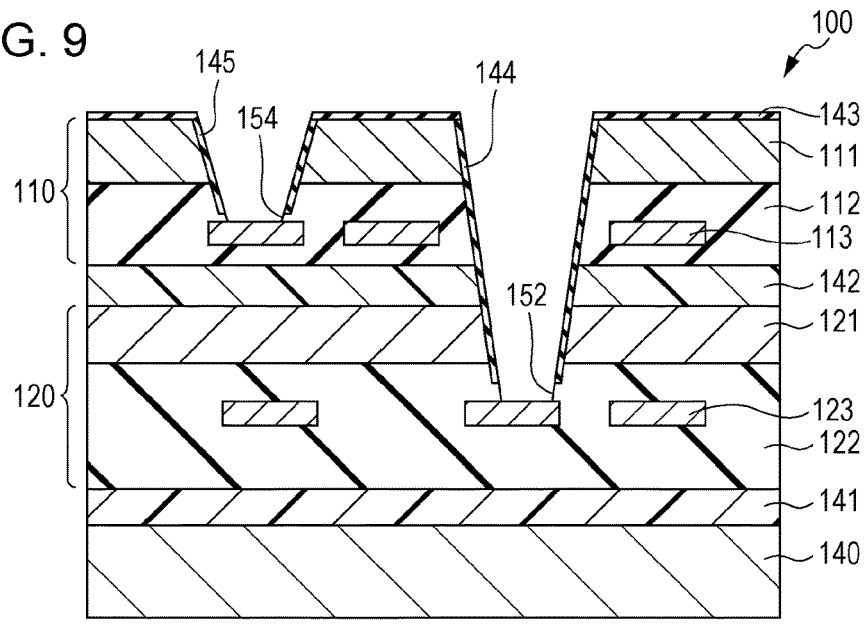
FIG. 9 is a view showing the manufacturing process of the semiconductor device according to the first embodiment.

By the first connection hole 151 in which the first insulating film 144 is formed and the second connection hole 152, a circular truncated cone shaped connection hole is formed in which the diameter decreases toward the second connection hole 152 side (refer to FIG. 9). The third insulating layer 143 protrudes to the inner side of the hole in the first connection hole 151 in which the first insulating film 144 is not formed (refer to FIG. 7). That is, a diameter of the first connection hole 151 which is formed on the third insulating layer 143 is smaller than that of the first connection hole 151 which is formed on the one surface of the first substrate.

The shapes of the first and the second connection holes 151 and 152 will be described in detail hereinafter.

The first via 146 is formed on the inner wall surfaces of the first connection hole 151 in which the first insulating film 144 is formed and the second connection hole 152. In FIG. 1, the first via 146 is formed so as to have a hole on the inner side. However, the inner portions of the first and the second connection holes 151 and 152 are filled with the first via, and a hole may not be formed in the inside.

For example, a second via 147 is a metal such as copper which is formed in the inner side of a third connection hole 153 and a fourth connection hole 154. The third connection hole 153 penetrates the third insulating layer 143 and the first substrate 111, and is formed up to the middle of the first insulating layer 112. The fourth connection hole 154 bores the first insulating layer 112 and is formed so that the first wiring 113 is exposed. The third connection hole 153 extends to the first insulating layer 112 side, and the fourth connection hole 154 is formed. A central axis of the fourth connection hole 154 is substantially the same as that of the third connection hole 153.

In the third connection hole 153, a second insulating film 145 is formed on the inner wall surface of the third connection hole 153 which is formed on the first substrate 111 and the first insulating layer 112. In FIG. 1, the second insulating film 145 is not formed on the third connection hole 153 which is formed on the third insulating layer 143 and the fourth connection hole 154. That is, the second insulating film 145 and the second via 147 are formed on the inner wall surface of the third connection hole 153. The second via 147 is formed on the inner wall surface of the fourth connection hole 154. Moreover, according to a size of the fourth connection hole 154, there is a case where the fourth connection hole 154 is embedded by the second via 147.

By the third connection hole in which the second insulating film 145 is formed and the fourth connection hole 154, a circular truncated cone shaped connection hole is formed in which the diameter decreases toward the fourth connection hole 154 side (refer to FIG. 9). The third insulating layer 143 protrudes to the inner side of the hole in the first connection hole 151 in which the second insulating film 145 is not formed (refer to FIG. 5). That is, a diameter of the third connection hole 153 which is formed on the third insulating layer 143 is smaller than that of the third connection hole 153 which is formed on the one surface of the first substrate.

The shapes of the third and the fourth connection holes 153 and 154 will be described in detail hereinafter.

One end of the first via 146 is electrically connected to the second wiring 123. One end of the second via 147 is electrically connected to the first wiring 113. One end of the connection wiring 148 is connected to the other end of the first via 146 and the other end of the connection wiring 148 is connected to the other end of the second via 147. Thereby, the first wiring 113 of the first semiconductor wafer 110 is electrically connected to the second wiring 123 of the second semiconductor wafer 120.

Next, a method of manufacturing the semiconductor device 100 according to the embodiment will be described with reference to FIGS. 2 to 9. In addition, since a method of manufacturing the first and the second semiconductor wafers 110 and 120 is the same as that in the related art, the description is omitted.

Figure 2:
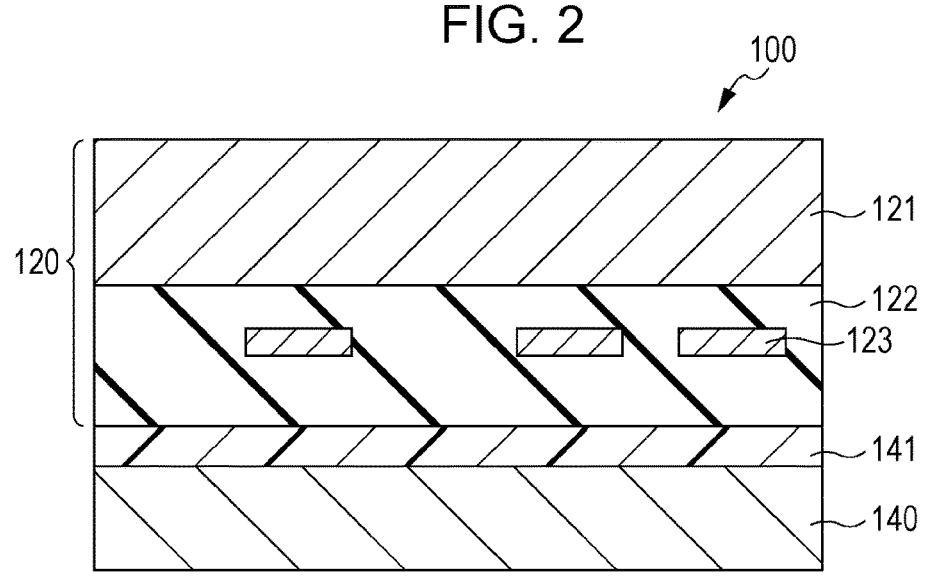
FIG. 2 is a view showing a manufacturing process of the semiconductor device according to the first embodiment.

As shown in FIG. 2, the second semiconductor wafer 120 is bonded on the supporting substrate 140 through the first connection layer 141. At this time, the supporting substrate 140 and the second insulating layer 122 are bonded to each other. For example, the bonding is performed by forming the first connection layer 141 formed of a siloxane-based resin film of about 0.5 μm on the supporting substrate 140, bonding the second insulating layer 122 on the first connection layer 141, heating them at about 200° C., and pressing them under 10 kN.

Figure 3:
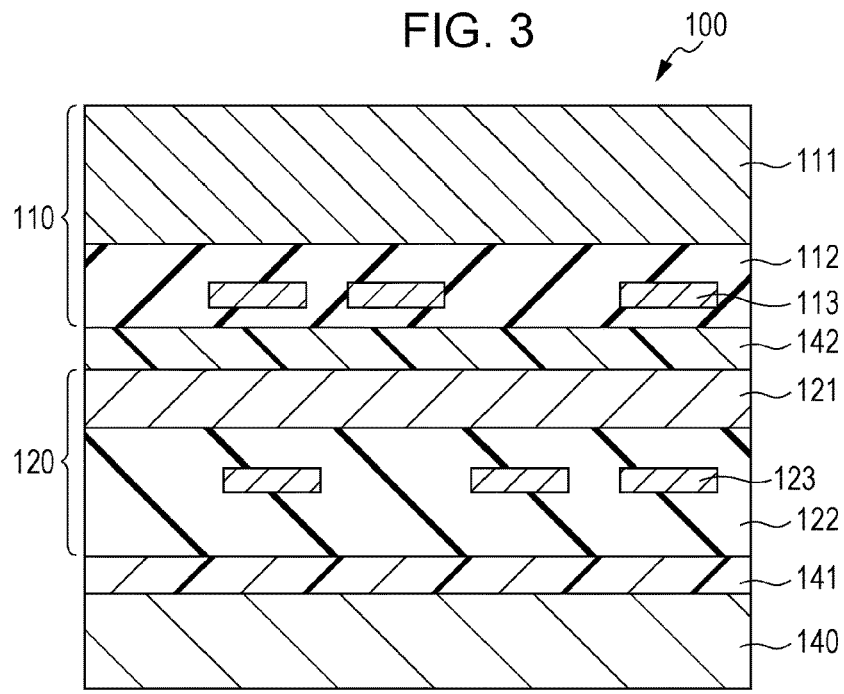
FIG. 3 is a view showing the manufacturing process of the semiconductor device according to the first embodiment.

Next, as shown in FIG. 3, the first semiconductor wafer 110 is bonded on the second semiconductor wafer 120 through the second connection layer 142. At this time, the second substrate 121 and the first insulating layer 112 are bonded to each other. Specifically, first, the surface of the second substrate 121 is ground so that a film thickness of the second substrate 121 is up to 50 μm or less by a grinder. Thereafter, grinding and surface planarizing are performed with respect to the surface of the second substrate 121 by a CMP (Chemical Mechanical Polishing) method or the like, for example, the second substrate 121 is thinned so that the film thickness is about 10 μm. Next, similar to FIG. 2, by forming the second connection layer 142 formed of a siloxane-based resin film of about 0.5 μm on the second substrate 121, bonding the first insulating layer 112 on the second connection layer 142, heating them at about 200° C., and pressing them under 10 kN, the second semiconductor wafer 120 and the first semiconductor wafer 110 are bonded to each other.

Figure 4:
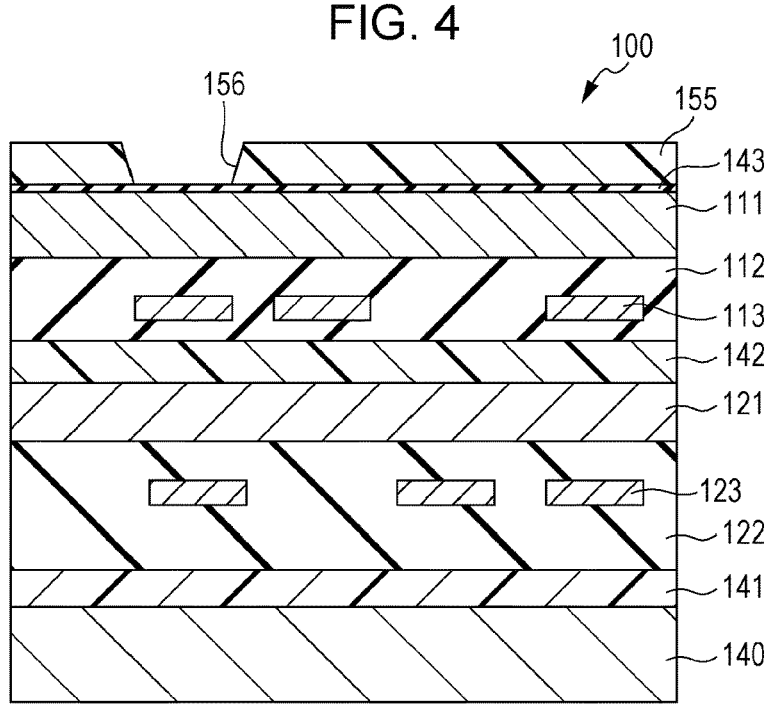
FIG. 4 is a view showing the manufacturing process of the semiconductor device according to the first embodiment.

As shown in FIG. 4, the first substrate 111 is thinned, the third insulating layer 143 is formed on the first substrate 111, and a resist 155, in which a hole 156 is formed at a position corresponding to the third connection hole 153, is formed.

Specifically, first, for example, the first substrate 111 is thinned to about 10 μm by using a grinder or the CMP method similar to the second substrate 121. The third insulating layer 143 is formed on the other surface of the thinned first substrate 111. For example, SiON of about 100 nm is formed on the first substrate 111 by using a CVD (Chemical Vapor Deposition) method, and therefore, the third insulating layer 143 is formed. Next, the resist 155 having an approximately circular opening portion 156 is patterned on the third insulating layer 143 at the position corresponding to the third connection hole 153 by lithography. For example, a diameter of the opening portion 156 provided on the resist 155 is about 10 μm.

Figure 5:
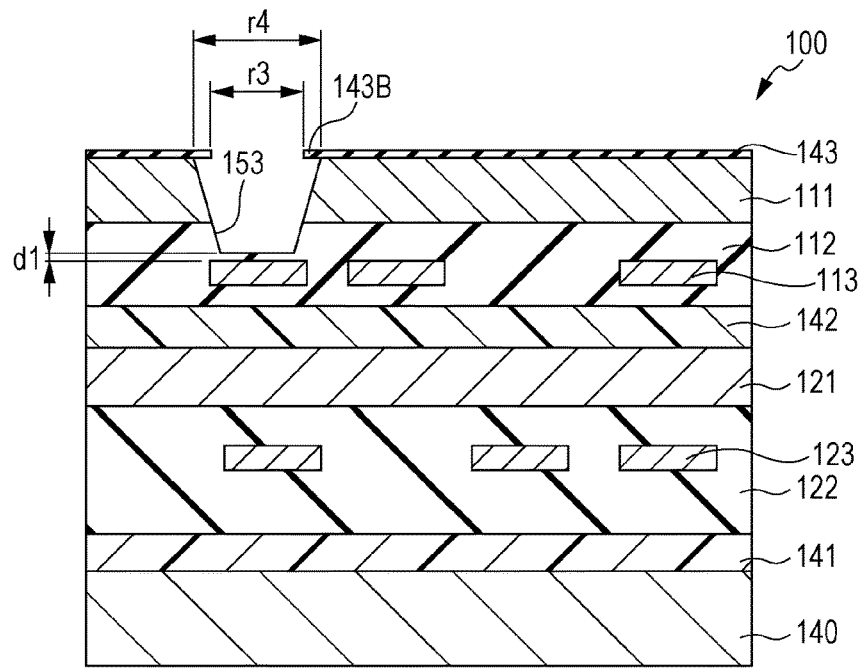
FIG. 5 is a view showing the manufacturing process of the semiconductor device according to the first embodiment.

As shown in FIG. 5, dry etching is performed with the resist 155 as a mask, and the third connection hole 153 which penetrates the third insulating layer 143 and the first substrate 111 and penetrates up to the middle of the first insulating layer 112 is formed. At this time, the etching is performed so that the lower side of the third insulating layer 143 is an undercut of about 200 nm. The etching of first substrate 111 proceeds more rapidly than that of the third insulating layer 143, and as shown in FIG. 5, the first substrate 111 under the third insulating layer 143 is etched. Thereby, the third connection hole 153 has a shape in which the third insulating layer 143 protrudes to the inner side of the third connection hole 153. That is, the third insulating layer 143 includes a portion 143B which protrudes to the inner side of the third connection hole 153. Accordingly, a diameter r3 of the third connection hole 153 which is formed on the third insulating layer 143 is smaller than a diameter r4 of the third connection hole 153 which is formed on the one surface of the first substrate 111 (r3<r4). Moreover, for example, the difference between the diameter r3 and the diameter r4, that is, amount of undercut (length of protruded portion 143B) becomes substantially the same as the thickness of the second insulating film 145 which is formed at the subsequent process.

The third connection hole 153 penetrates the third insulating layer 143 and the first substrate 111, and the first insulating layer 112 is dug so that the film thickness of the first insulating layer 112 on the first wiring 113 is only d1 and the third connection hole 153 is formed. In FIG. 1, for example, the first insulating layer 112 is etched so that the film thickness d1 is about 100 nm on the first wiring 113.

In order to make the third connection hole 153 to the desired shape described above, for example, the etching may be performed while a flow rate of $SF_6$ gas and $O_2$ gas is controlled by a parallel plate plasma apparatus.

Figure 6:
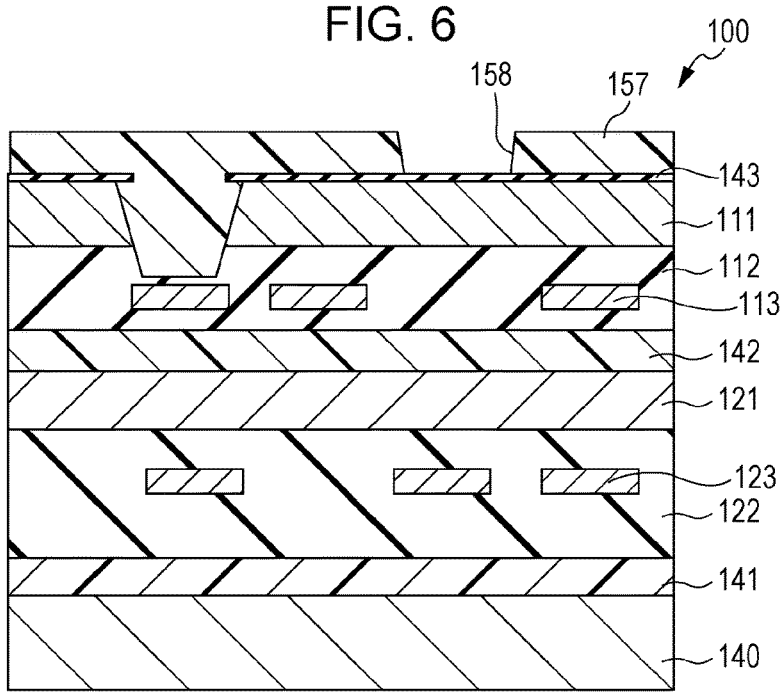
FIG. 6 is a view showing the manufacturing process of the semiconductor device according to the first embodiment.

As shown in FIG. 6, after the third connection hole 153 is formed, a resist 157 is formed so as to bury the third connection hole 153, and an approximately circular opening portion 158 is patterned at a position corresponding to the first connection hole 151 by lithography. For example, the diameter of the opening portion 158 which is provided in the resist 157 is about 10 μm.

Figure 7:
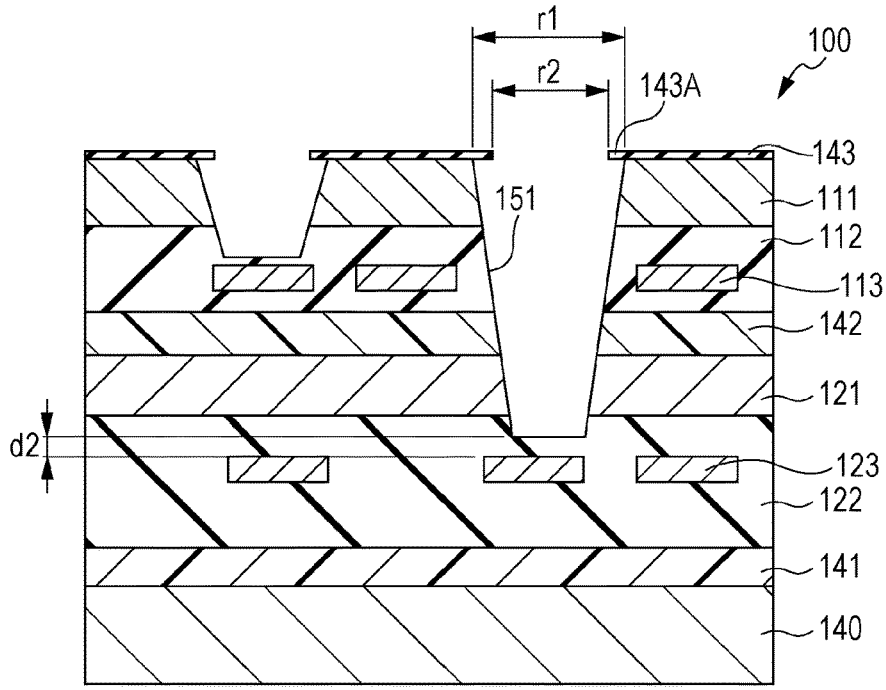
FIG. 7 is a view showing the manufacturing process of the semiconductor device according to the first embodiment.

As shown in FIG. 7, dry etching is performed with the resist 157 as the mask, the first connection hole 151 penetrates the third insulating layer 143, the first substrate 111, the first insulating layer 112, and the second connection layer 142, and is formed up to the middle of the second insulating layer 122. At this time, similar to the case where the third connection hole 153 is formed, the etching is performed so that the lower side of the third insulating layer 143 is an undercut of about 200 nm. The first connection hole 151 has a shape in which the third insulating layer 143 protrudes to the inner side of the first connection hole 151. The third insulating layer 143 includes a portion 143A which protrudes to the inner side of the first connection hole 151. Accordingly, a diameter r1 of the first connection hole 151 which is formed on the third insulating layer 143 is smaller than a diameter r2 of the first connection hole 151 which is formed on the one surface of the first substrate 111 (r1<r2). Moreover, for example, the difference between the diameter r1 and the diameter r2, that is, amount of undercut (length of protruded portion 143A) becomes substantially the same as the thickness of the first insulating film 144 which is formed at the subsequent process.

The first connection hole 151 penetrates the third insulating layer 143, the first substrate 111, the first insulating layer 112, and the second connection layer 142, and the second insulating layer 122 is dug so that the film thickness of the second insulating layer 122 on the second wiring 123 is only d2 and the first connection hole 151 is formed. The film thickness d2 of the second insulating layer 122 which remains on the second wiring 123 is larger than the film thickness d1 of the first insulating layer 112 which remains on the first wiring 113. In FIG. 1, for example, the film of the second insulating layer 122 which remains on the second wiring 123 is etched so that the film thickness d2 is about 600 nm.

Figure 8:
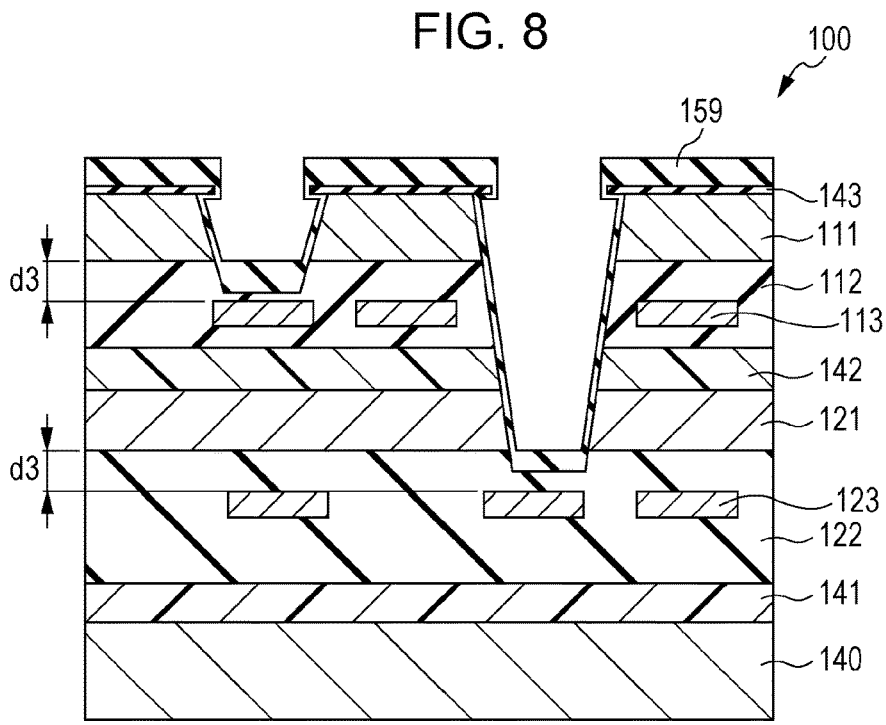
FIG. 8 is a view showing the manufacturing process of the semiconductor device according to the first embodiment.

As shown in FIG. 8, an insulating film 159 is formed on the third insulating layer 143 and the inner sides of the first and the third connection holes 151 and 153. Specifically, the insulating film 159 is formed so that the thickness of the insulating film 159 formed on the inner side walls of the first and the third connection holes 151 and 153 is the approximately the same as the amount of the undercut (about 200 nm in the embodiment) of the third insulating layer 143. Specifically, for example, when the insulating film 159 of $SiO_2$ is formed by a CVD method, the insulating film 159 having the film thickness of about 1000 nm may be formed on the third insulating layer 143.

If the insulating film 159 is formed by the CVD method, the thickness of the insulating film 159 formed on the bottom surfaces of the connection holes becomes thinner as the depths of the connections holes become deeper. Specifically, for example, if the insulating film 159 having the film thickness of about 1000 nm is formed on the third insulating layer 143, the insulating film 159 having the film thickness of about 700 nm is formed on the bottom surface of the third connection hole 153. In addition, the insulating film 159 having the film thickness of about 200 nm is formed on the bottom surface of the first connection hole 151.

Here, as described above, in the embodiment, since the film thickness d1 of the first insulating layer 112 which remains on the first wiring 113 is about 100 nm, the thickness of the film (first insulating layer 112 and insulating film 159) formed on the first wiring 113 is d3=100 nm+700 nm=800 nm. Since the film thickness d2 of the second insulating layer 122 which remains on the second wiring 123 is about 600 nm, the thickness of the film (second insulating layer 122 and insulating film 159) formed on the second wiring 123 is 600 nm+200 nm=800 nm. In this way, as shown in FIGS. 5 and 7, since the film thickness of the insulating layer which remains on the first and the second wirings 113 and 123 is adjusted, even when the film thickness of the insulating film formed on the bottom surface becomes thinner as the depth of the connection hole becomes deeper like the CVD method, the thicknesses d3 of the films formed on the first and the second wirings 113 and 123 can be the same as each other.

In addition, if the thickness of the insulating film 159 formed on the inner wall surface of the first connection hole 151 and the third connection hole 153 and the thickness d3 of the films formed on the wirings 113 and 123 can be a desired thickness, the thickness d1 of the first insulating layer 112 which remains on the first wiring 113 may be 0. That is, the first wiring 113 is exposed when the third connection hole 153 is formed, and the fourth connection hole 154 may be omitted.

As shown in FIG. 9, the film (first insulating layer 112 and insulating film 159) formed on the first wiring 113 are removed by etching, the fourth connection hole 154 is formed, and the first wiring 113 is exposed. Similarly, the film (second insulating layer 122 and insulating film 159) formed on the second wiring 123 are removed by etching, the second connection hole 152 is formed, and the first wiring 113 is exposed.

At this time, since etching having high anisotropy is performed, the insulating film 159 which is formed on the third insulating layer 143 and on the bottom surface of the first connection hole 151 and the third connection hole can be removed while the insulating film 159 formed on the inner side walls of the first connection hole 151 and the third connection hole 153 remains. According to this etching, the first insulating film 144, the second insulating film 145, the second connection hole 152, and the fourth connection hole 154 are formed.

For example, the etching having high anisotropy is obtained be using a RF power applied to the substrate of 1000 W or more by using $C_4F_8$, $O_2$, and Ar gas through a parallel plate plasma apparatus. Since the etching is performed under these conditions, a speed of the etching can be constant regardless of the depth of the connection hole, a micro-floating can be decreased, and the depth of the second connection hole 152 can be substantially the same as the depth of the fourth connection hole 154.

Moreover, as described above, the third insulating layer 143 has an eaves shape which protrudes to the inner side of the first connection hole 151 and the third connection hole 153. The length of the protruded portions 143A and 143B of the third insulating layer 143 is substantially the same as the film thickness of the insulating film 159 which is formed on the inner wall surfaces of the first connection hole 151 and the third connection hole 153. Thereby, the protruded portions 143A and 143B of the third insulating layer 143 become the mask of the insulating film 159 which is formed on the inner wall surfaces of the first connection hole 151 and the third connection hole 153, the insulating film 159 which is formed on the inner wall surfaces of the first connection hole 151 and the third connection hole 153 is not excessively etched, and the first substrate 111 is not easily exposed.

Continuously, after a barrier metal (not shown) and a Cu seed layer (not shown) are formed by a sputtering method, a resist (not shown) is patterned on positions other than the position corresponding to the connection wiring 148 by lithography, and a Cu plating is performed by a plating method. Thereafter, unnecessary barrier metals are removed, the connection wiring 148 is formed, and therefore, the semiconductor device shown in FIG. 1 is obtained.

As described above, in the semiconductor device 100 of the embodiment, when the first connection hole 151 and the third connection hole 153 are formed in order to form the first via 146 and the second via 147, since the insulating layer of only the film thickness corresponding to the depths of each connection hole remains on each wiring, the thicknesses d3 of the films (insulating layer and insulating film 159) which are formed on each wiring when the insulating film 159 is formed are the same as each other. Accordingly, even when the second connection hole 152 and the fourth connection hole 154 are formed by etching and each wiring is exposed, since speeds of the etchings are substantially the same as each other, the time of each wiring exposed to the etching can be substantially uniform and short, and influence on wiring due to the etching can be suppressed.

Moreover, since the diameter r1 of the first connection hole 151 which is formed on the third insulating layer 143 is smaller than the diameter r2 of the first connection hole 151 which is formed on the one surface of the first substrate 111, the portion 143A protruding to the inner side of the first connection hole 151 is formed in the third insulating layer 143. Similarly, since the diameter r3 of the third connection hole 153 which is formed on the third insulating layer 143 is smaller than the diameter r4 of the third connection hole 153 which is formed on the one surface of the first substrate 111, the portion 143B protruding to the inner side of the third connection hole 153 is formed in the third insulating layer 143. Since the protruded portions 143A and 143B of the third insulating layer 143 become the mask when the first insulating film 144 and the second insulating film 145 are formed, exposure of the first substrate 111 due to the removing of the insulating film 159 through the etching may not be generated. Thereby, the first substrate 111 may not be exposed by the etching.

As described above, in the semiconductor device 100 according to the embodiment, it is possible to connect circuits of the laminated semiconductor wafers while suppressing the influence on the substrate or the wiring due to etching when the via is formed.

In addition, when each substrate and each insulating layer can be directly bonded to each other, the first connection layer 141 and the second connection layer 142 may be omitted.

First Modification

Figure 10:
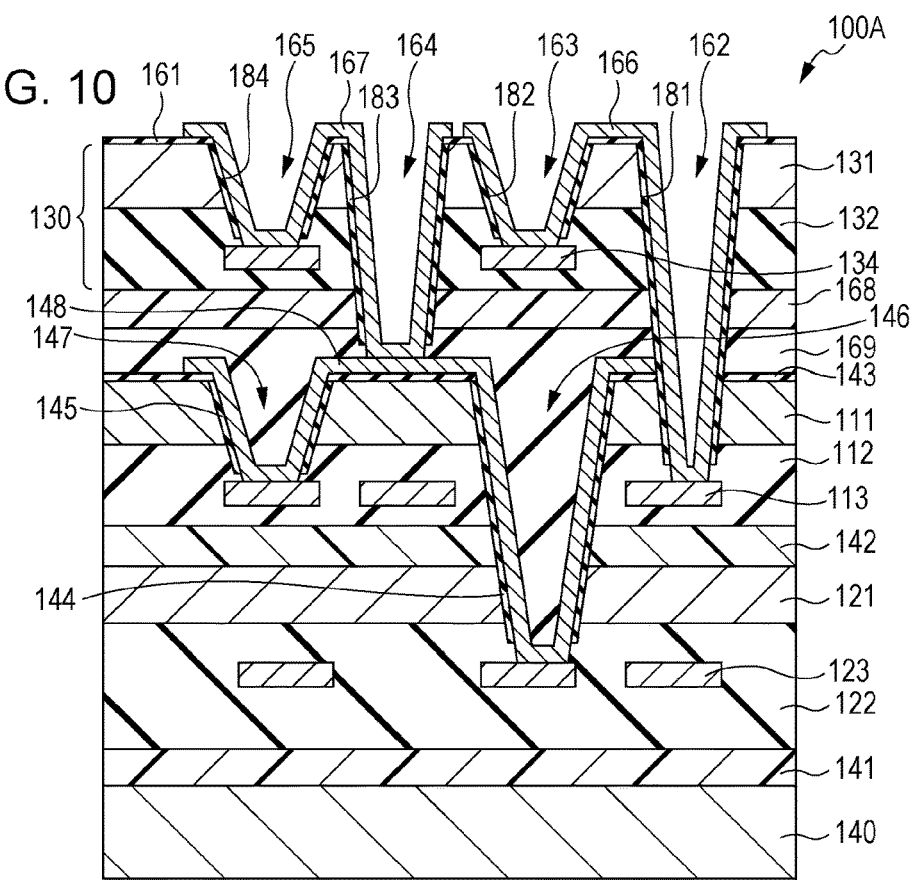
FIG. 10 is a view showing a semiconductor device according to a first modification.

Next, a first modification of the first embodiment will be described. FIG. 10 is a view showing a semiconductor device 100A according to the modification. The modification is different with the semiconductor device 100 of FIG. 1 in that a third semiconductor wafer 130 is laminated on the first semiconductor wafer 110.

As shown in FIG. 10, the semiconductor device 100A includes a fourth insulating layer 169 which is formed so as to bury the first to the fourth connection holes 151 to 154 on the third insulating layer 143. The third semiconductor wafer 130 is laminated on the fourth insulating layer 169 through a third connection layer 168.

The third semiconductor wafer 130 includes a third substrate 131, a fifth insulating layer 132 which is formed so as to come into contact with one surface of the third substrate 131, and a third wiring 133 which is formed on the fifth insulating layer 132. For example, the third substrate 131 is formed of silicon. For example, the third wiring 133 is formed of a metal such as copper. The third connection layer 168 is connected to a surface of a side opposite to the surface which comes into contact with the third substrate 131 of the fifth insulating layer 132, and connects the third semiconductor wafer 130 and the first semiconductor wafer 110 to each other. For example, the third connection layer 168 is formed of a siloxane-based resin film. In addition, when the fourth insulating layer 169 and the fifth insulating layer 132 can be directly bonded, the third connection layer 168 may be omitted.

The first wiring 113 of the first semiconductor wafer 110 and the third wiring 133 of the third semiconductor wafer 130 are connected to each other through a third via 162, a fourth via 163, and a connection wiring 166. In addition, the connection wiring 148 and the third wiring 133 are connected to each other through a fifth via 164, a sixth via 165, and a connection wiring 167.

The semiconductor device 100A includes a sixth insulating layer 161 on the other surface which is parallel to the one surface of the third substrate 131. Moreover, the third via 162 penetrates the sixth insulating layer 161, the third substrate 131, the fifth insulating layer 132, the third connection layer 168, the fourth insulating layer 169, the third insulating layer 143, and the first substrate 111 and is formed up to the middle of the first insulating layer 112, and the one end of the third via is connected to the first wiring 113. The semiconductor device 100A includes a third insulating film 181 which penetrates the third substrate 131, the fifth insulating layer 132, the third connection layer 168, the fourth insulating layer 169, the third insulating layer 143, and the first substrate 111 and is formed up to the middle of the first insulating layer 112. The third insulating film 181 is not formed on the same layer as the sixth insulating layer 161 and is not provided with a constant thickness on the first wiring 113.

The fourth via 163 penetrates the sixth insulating layer 161 and the third substrate 131 and is formed up to the middle of the fifth insulating layer 132, and the one end of the fourth via is connected to the third wiring 133. The semiconductor device 100A includes a fourth insulating film 182 which penetrates the sixth insulating layer 161 and the third substrate 131 and is formed up to the middle of the fifth insulating layer 132. The fourth insulating film 182 is not formed on the same layer as the sixth insulating layer 161 and is not provided with a constant thickness on the third wiring 133.

One end of the connection wiring 166 is connected to the other end of the third via 162, and the other end of the connection wiring 166 is connected to the other end of the fourth via 163.

The fifth via 164 penetrates the sixth insulating layer 161, the third substrate 131, the fifth insulating layer 132, and the third connection layer 168 and is formed up to the middle of the fourth insulating layer 169, and the one end of the fifth via is connected to the connection wiring 148. The semiconductor device 100A includes a fifth insulating film 183 which penetrates the third substrate 131, the fifth insulating layer 132, and the third connection layer 168 and is formed up to the middle of the fourth insulating layer 169. The fifth insulating film 183 is not formed on the same layer as the sixth insulating layer 161 and is not provided with a constant thickness on the connection wiring 148.

The sixth via 165 penetrates the sixth insulating layer 161 and the third substrate 131 and is formed up to the middle of the fifth insulating layer 132, and the one end of the sixth via 165 is connected to the third wiring 133. The semiconductor device 100A includes a sixth insulating film 184 which penetrates the sixth insulating layer 161 and the third substrate 131 and is formed up to the middle of the fifth insulating layer 132. The sixth insulating film 184 is not formed on the same layer as the sixth insulating layer 161 and is not provided with a constant thickness on the third wiring 133.

One end of the connection wiring 167 is connected to the other end of the fifth via 164 and the other end of the connection wiring 167 is connected to the other end of the sixth via 165.

Each insulating film is formed so as to be separated by a predetermined distance from each wiring. The distance is lengthened according to a depth of the via corresponding to each insulating film. The depth of each via becomes shallower in the order of the third via 162, the fifth via 164, and the fourth via 163, and the depth of the fourth via 163 is substantially the same as the depth of the fifth via 164. Accordingly, the distance between each wiring and each insulating film, that is, the film thickness of the insulating layer which remains on each wiring becomes shallower in the order of the third insulating film 181, the fifth insulating film 183, and the fourth insulating film 182, and the distance up to the fourth insulating film 182 is substantially the same as the distance up to the sixth insulating film.

Figure 11:
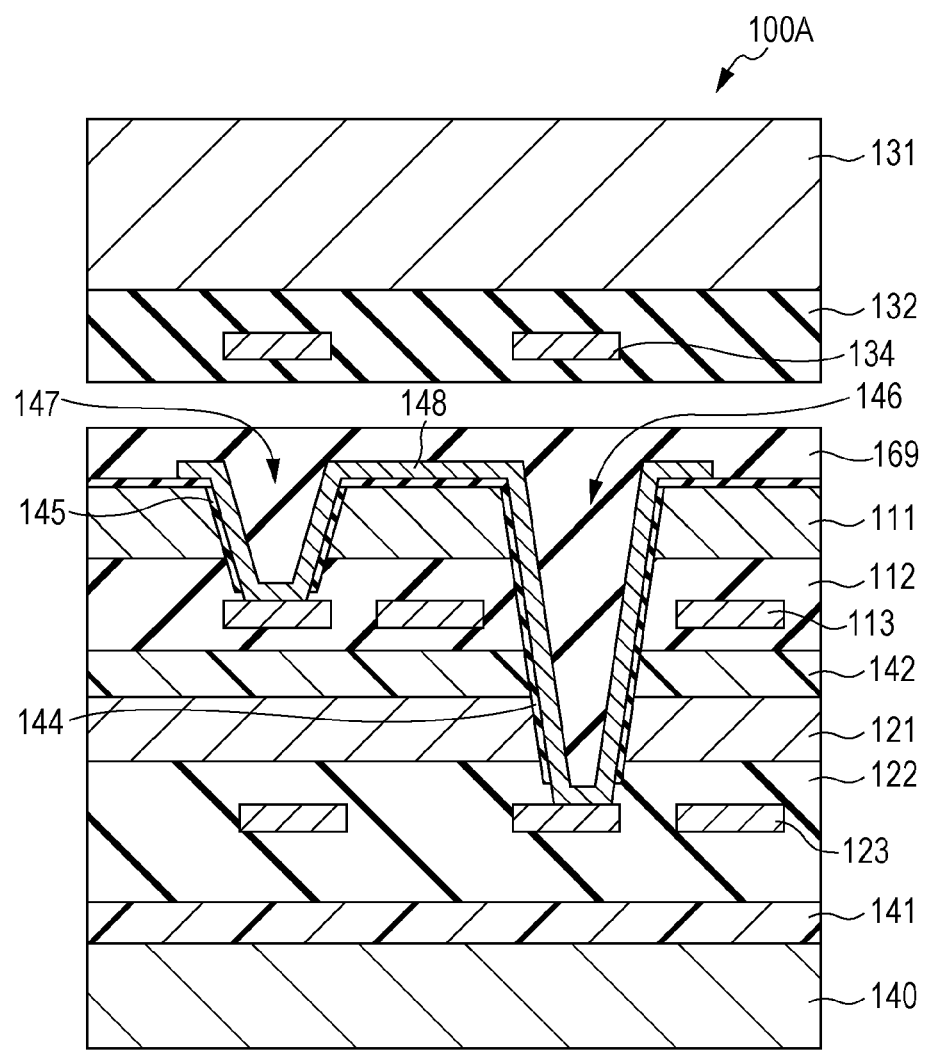
FIG. 11 is a view showing a manufacturing process of the semiconductor device according to the first modification.

The method for laminating the third semiconductor wafer 130 will be described with reference to FIGS. 11 and 12. First, as shown in FIG. 11, for example, after $SiO_2$ is formed on the third insulating layer 143 by a CVD method so as to bury the first to the fourth connection holes 151 to 154, the fourth insulating layer 169 is formed by being planarized through a CMP method. Thereafter, the third semiconductor wafer 130 is disposed so that the fourth insulating layer 169 and the fifth insulating layer 132 face each other.

Figure 12:
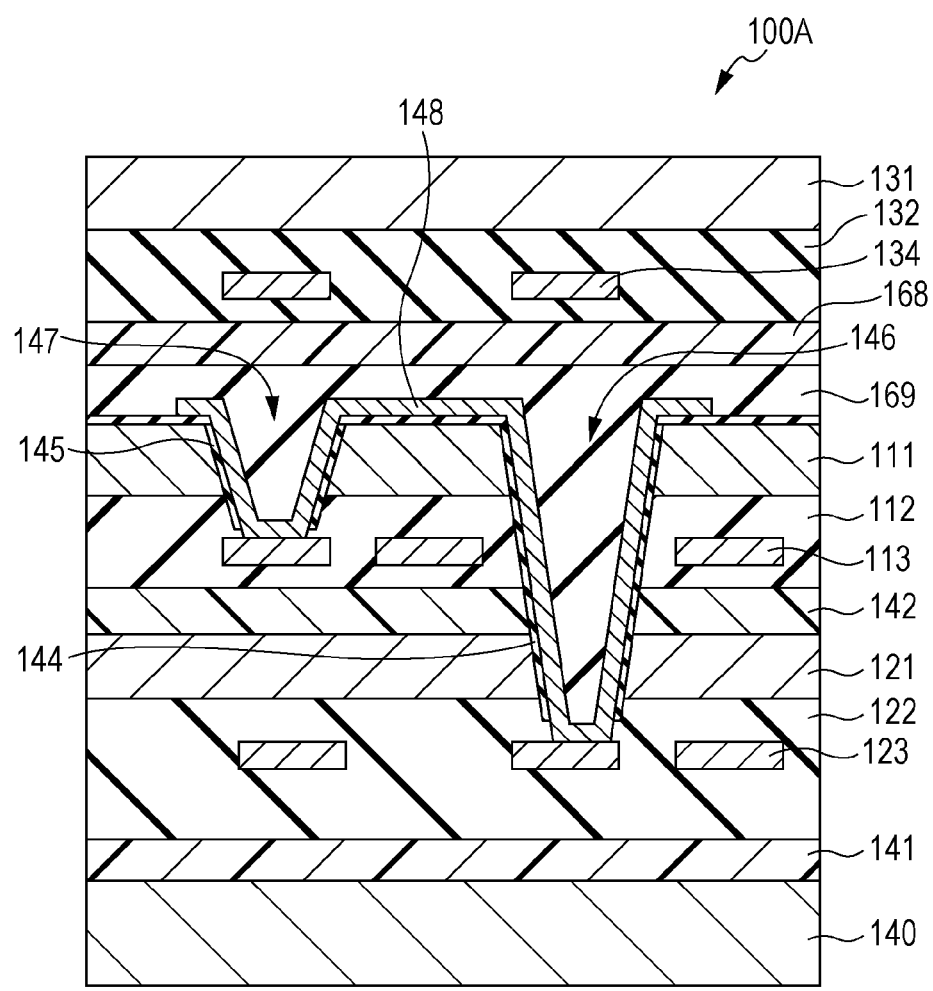
FIG. 12 is a view showing the manufacturing process of the semiconductor device according to the first modification.

As shown in FIG. 12, the third connection layer 168 is formed between the first semiconductor wafer 110 and the third semiconductor wafer 130 and the first semiconductor and the third semiconductor wafer 130 are bonded to each other. Thereafter, the third substrate 131 is ground and surface-planarized by a grinder, a CMP method, or the like, and therefore, for example, the third substrate 131 is thinned so that the film thickness is about 10 μm.

In addition, since the method for forming each via is the same as that of the first embodiment, the description is omitted.

As described above, similar to the case where two semiconductor wafers are laminated, it is possible to connect circuits in which three or more semiconductor wafers are laminated while suppressing the influence on the substrate or the wiring due to etching when the via is formed.

Second Modification

Figure 13:
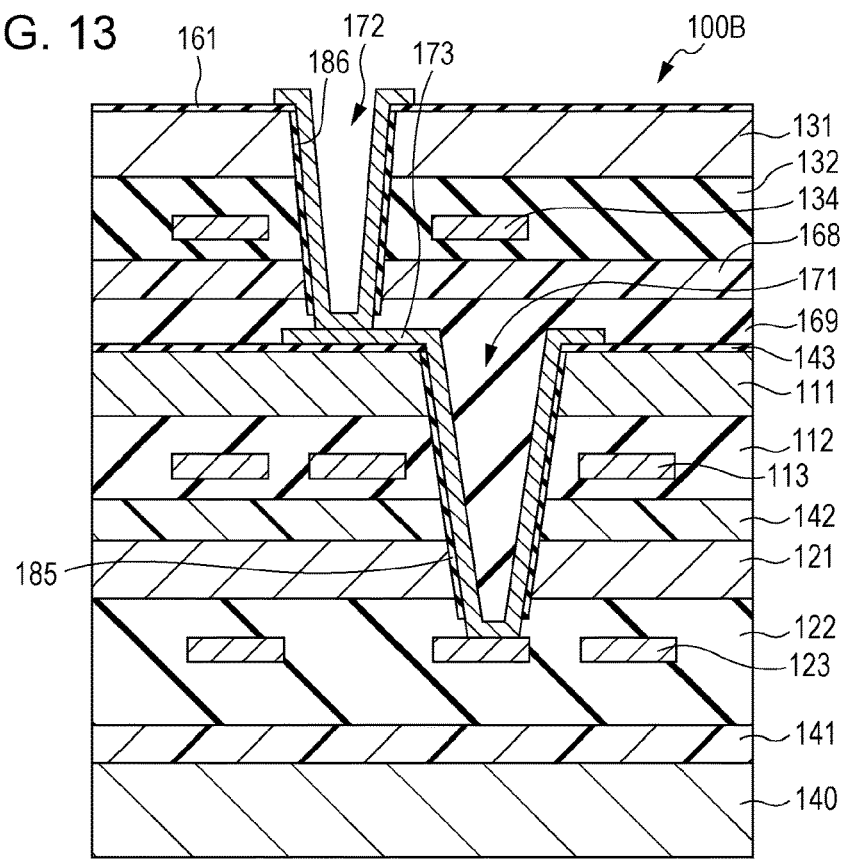
FIG. 13 is a view showing a semiconductor device according to a second modification.

Next, a second modification of the first embodiment will be described. FIG. 13 is a view showing a semiconductor device 100B according to the modification. In the modification, wirings of each semiconductor wafer are not connected to each other, and the wirings and the via are connected to each other in order to connect the wirings to an external device (not shown). The configurations other than the above configuration are the same as those of the semiconductor device 100A shown in FIG. 10.

As shown in FIG. 13, the semiconductor device 100B includes a seventh via 171 in which the one end is connected to the second wiring 123, a connection wiring 173 in which the one end is connected to the other end of the seventh via 171, and an eighth via 172 in which the one end is connected to the connection wiring 173. Thereby, the second wiring 123 of the second semiconductor wafer 120 can be connected to the external device (not shown).

The configuration of the seventh via 171 is the same as that of the first via. In addition, a configuration of a seventh insulating film 185 which is formed so as to come into contact with one surface of the seventh via 171 is the same as that of the first insulating film 144. The configuration of the connection wiring 173 is the same as that of the connection wiring 148 except that the other end of the connection wiring 173 is not connected to the via. In addition, the configuration of the eighth via 172 is the same as that of the fifth via 164 except that the other end of the eighth via 172 is not connected to the connection wiring.

In this way, similar to the via or the connection wire which connects wirings of each semiconductor wafer, it is possible to connect the external device (not shown) and the wirings of each semiconductor wafer.

Second Embodiment

Figure 14:
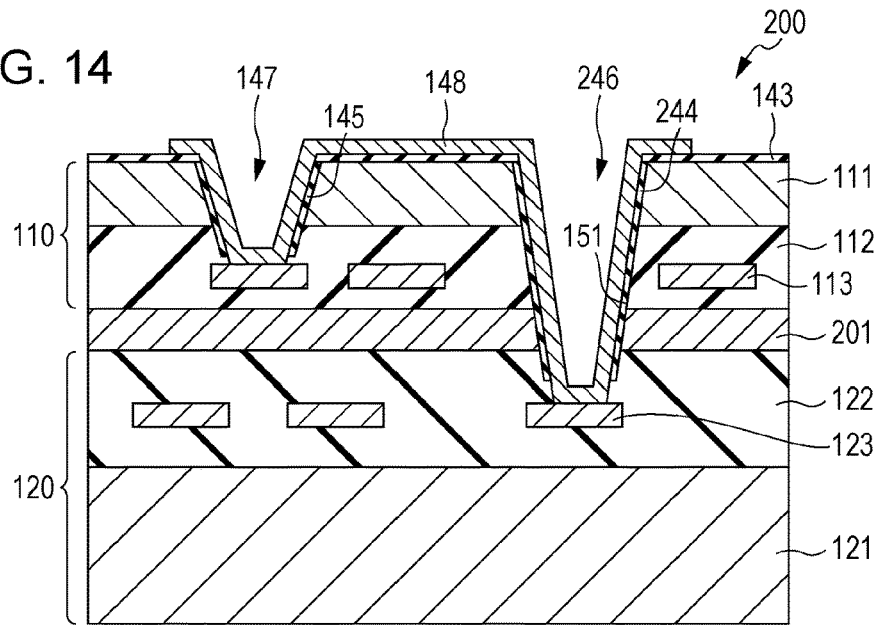
FIG. 14 is a view showing a semiconductor device according to a second embodiment.

FIG. 14 is a view showing a semiconductor device 200 according to a second embodiment. The semiconductor device 200 is different from the semiconductor device 100 of FIG. 1 in that the first semiconductor wafer 110 and the second semiconductor wafer 120 are bonded to each other so that the first insulating layer 112 and the second insulating layer 122 face each other.

As shown in FIG. 14, the semiconductor device 200 includes a second connection layer 201 in which one surface is connected to the first insulating layer 112 and the other surface substantially parallel to the one surface is connected to the second insulating layer 122. In addition, the semiconductor device 200 does not include the supporting substrate 140 of FIG. 1. Moreover, the second substrate 121 is not thinned unlike FIG. 1.

In addition, the first via 246 penetrates the third insulating layer 143, the first substrate 111, and the second connection layer 201 and is formed up to the middle of the second insulating layer 122. Moreover, the first insulating film 244 penetrates the first substrate 111 and second connection layer 201 and is formed up to the middle of the second insulating layer 122. In this way, the first via 246 and the first insulating film 244 are different from the first via 146 and the first insulating film 144 of FIG. 1 in that the first via 246 and the first insulating film 244 do not penetrate the second substrate 121.

In the semiconductor 200 of the embodiment, the insulating layers of the first semiconductor wafer 110 and the second semiconductor wafer 120 are bonded to each other, and therefore, the semiconductor wafers are laminated. Thereby, the first via 246 can be formed without penetrating the second substrate 121 and the depth of the first via 246 can be shallower compared to the first via 146 of FIG. 1. Therefore, the difference (step of each via) between the depth of the first via 246 and the depth of the second via decreases.

Figure 15:
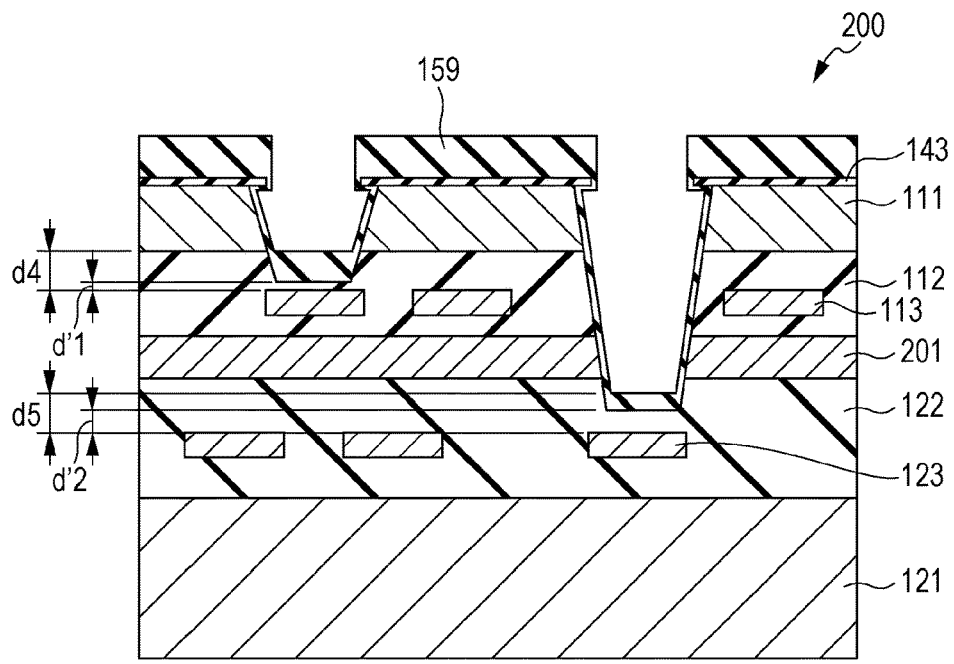
FIG. 15 is a view showing a manufacturing process of the semiconductor device according to the second embodiment.

Thus, in the embodiment, as shown in FIG. 15, a film thickness d'1 of the first insulating layer 112 which remains on the first wiring 113 and a film thickness d'2 of the second insulating layer 122 which remains on the second wiring 123 are adjusted, and a thickness d4 of the film which is formed on the first wiring 113 and a thickness d5 of the film which is formed on the second wiring 123 after the insulating film 159 is formed are substantially the same as each other. Specifically, the film thickness d'2 of the second insulating layer 122 is thinner than the film thickness d2 of the second insulating layer 122 shown in FIG. 7. This is because the first via 246 of FIG. 14 is shallower than the first via 146 of FIG. 1, and as shown in FIG. 15, the insulating film 159 formed on the bottom surface of the first connection hole 151 is thicker than that of FIG. 8. Accordingly, due to the fact that the film thickness d'2 of the second insulating layer 122 is thinner than the film thickness d2 of the second insulating layer 122 shown in FIG. 7, the thickness d4 of the film which is formed on the first wiring 113 and a thickness d5 of the film which is formed on the second wiring 123 after the insulating film 159 is formed can be substantially the same as each other.

In addition, FIG. 15 is a view showing the semiconductor device 200, in which the first and the third connection holes 151 and 153 are formed according to the same processes as those of the first embodiment after the insulating layers of the first semiconductor wafer 110 and the second semiconductor wafer 120 are bonded to each other, and the insulating film 159 is formed.

As described above, like the semiconductor device 200 according to the embodiment of the present disclosure, since the semiconductor wafers are laminated so that the insulating layers of each semiconductor wafer face each other, the effects similar to those of the first embodiment can be obtained even when steps of each via are decreased.

In addition, in the semiconductor device 200 of the embodiment of the present disclosure, the third semiconductor wafer may be further laminated like the first modification, and the semiconductor device may be connected to the external device (not shown) like the second modification.

Third Embodiment

Figure 16:
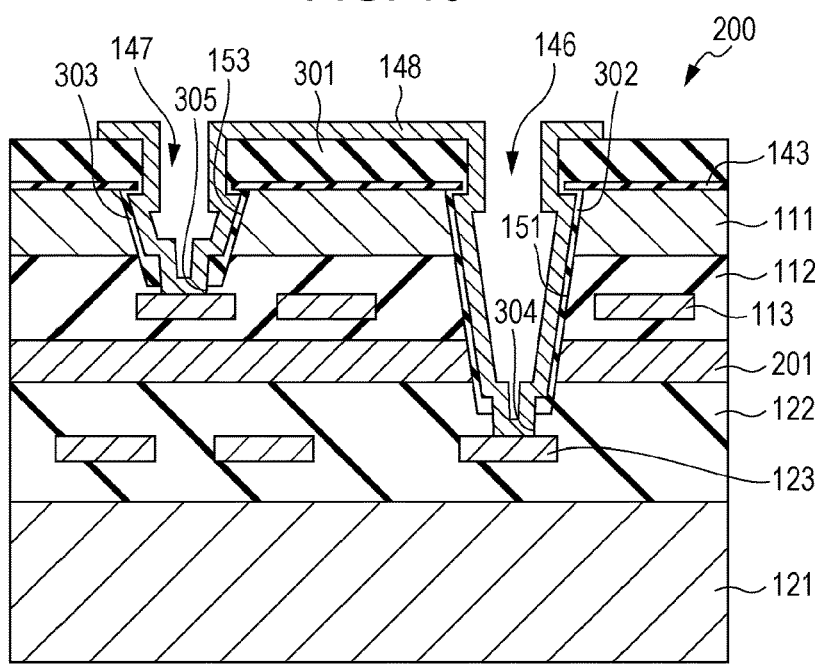
FIG. 16 is a view showing a semiconductor device according to a third embodiment.

FIG. 16 shows a semiconductor device 300 according to a third embodiment. The semiconductor device 300 according to the embodiment is different from the semiconductor device 200 shown in FIG. 14 in having an insulating film 301 on the third insulating layer 143 and in shapes of a first and a second insulating films 302 and 303 and shapes of a second connection hole 304 and a fourth connection hole 305.

For example, the insulating film 301 is formed of $SiO_2$.

The first insulating film 302 is formed on the inner wall surface of the first connection hole 151. The first insulating film 302 includes a step in which the film thickness of the first insulating film 302 formed on the second wiring 123 side is thicker than the film thickness of the third insulating layer 143 side. In addition, in the embodiment, the second insulating film 303 is formed also on the inner wall surface of the third connection hole 153 which is formed on the third insulating layer 143.

The second insulating film 303 is formed on the inner wall surface of the third connection hole 153. The second insulating film 303 includes a step in which the film thickness of the second insulating film 303 formed on the first wiring 113 side is thicker than the film thickness of the third insulating layer 143 side. The step of the second insulating film 303 is greater compared to the step of the first insulating film 302. In addition, in the embodiment, the second insulating film 303 is formed also on the inner wall surface of the first connection hole 151 which is formed on the third insulating layer 143.

Moreover, since the first via 146 and the second via 147 are formed on the inner wall surface of the first connection hole 151 in which the first insulating film 302 is formed and the inner wall surface the third connection hole 153 in which the second insulating film 303 is formed, the first via and the second via include shapes which are curved along the shapes of the inner wall surfaces. In addition, the connection wiring 148 is formed on the insulating film 301.

Next, a method of manufacturing the semiconductor device 300 of the embodiment will be described with reference to FIGS. 17 and 18. Moreover, the method is the same as the method of manufacturing the semiconductor device 100 shown in FIG. 8 until the insulating film 159 is formed.

Figure 17:
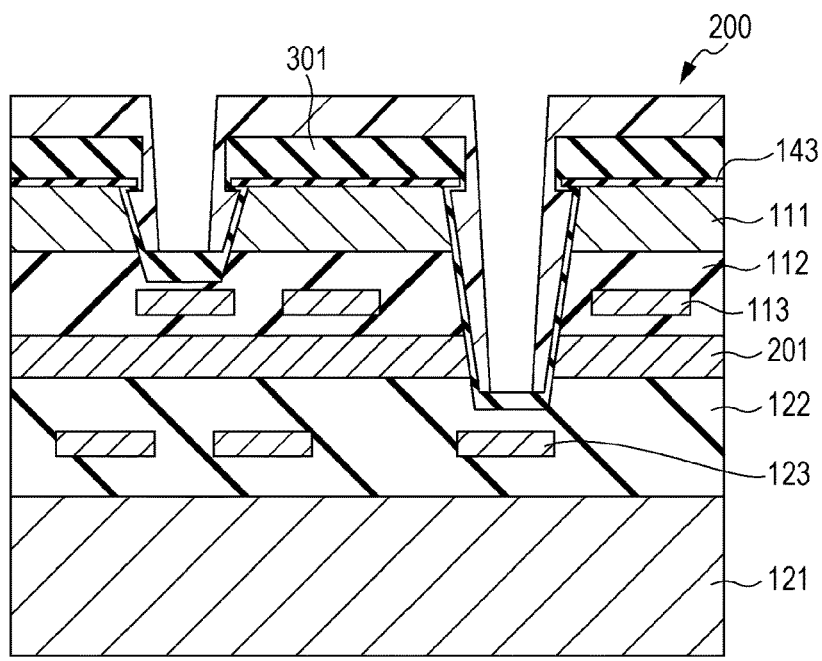
FIG. 17 is a view showing a manufacturing process of the semiconductor device according to the third embodiment.

As shown in FIG. 17, after the insulating film 159 is formed, a resist 306 having an opening in which the diameter is smaller than the first connection hole 151 and the third connection hole 153 is patterned at a position corresponding to the first connection hole 151 and the third connection hole 153. Next, the film formed on the first wiring 113 and the film formed on the second wiring 123 are removed by an etching having high anisotropy with the resist 306 as the mask, and the first wiring 113 and the second wiring 123 are exposed. Moreover, the condition of the etching having high anisotropy which is performed in the embodiment may be similar to that of the etching which is performed in FIG. 9.

Figure 18:
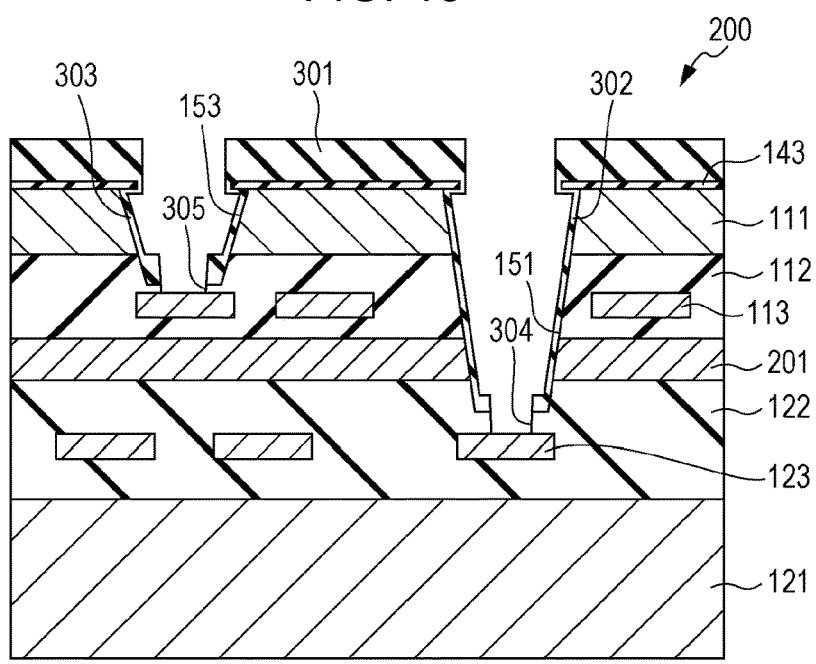
FIG. 18 is a view showing the manufacturing process of the semiconductor device according to the third embodiment.

In this way, since the etching having high anisotropy is performed with the resist 306 as the mask, as shown in FIG. 18, the insulating film 301, the first insulating film 302, and the second insulating film 303 can be formed. In addition, the second connection hole 304 having the smaller diameter than that of the first connection hole 151 and the fourth connection hole 305 having the smaller diameter than that of the third connection hole 153 can be formed. Since the first via 146, the second via 147, and the connection wiring 148 are formed, the semiconductor device 300 shown in FIG. 16 can be obtained. Moreover, the method for forming the first via 146, the second via 147, and the connection wiring 148 is the same as that of the first embodiment.

In this way, since the second connection hole 304 having the smaller diameter than that of the first connection hole 151 is formed and the fourth connection hole 305 having the smaller diameter than that of the third connection hole 153 is formed, the area of the exposed wiring can be decreased, and the area of the wiring which is exposed to the etching can be decreased. This is particularly advantageous in a case where the diameters of the first connection hole 151 and the third connection hole 153 are the size of several tens of nm to several hundreds of nm. In addition, since the insulating film 301 is not removed by the etching, the embodiment is advantageous in a case of substantially thickening the third insulating layer 143 on the surface of the first substrate 111.

Fourth Embodiment

Next, in a fourth embodiment, an application of the semiconductor device 100 will be described. Here, a case where the semiconductor device 100 is applied to a solid-state imaging device 400 is described.

Figure 19:
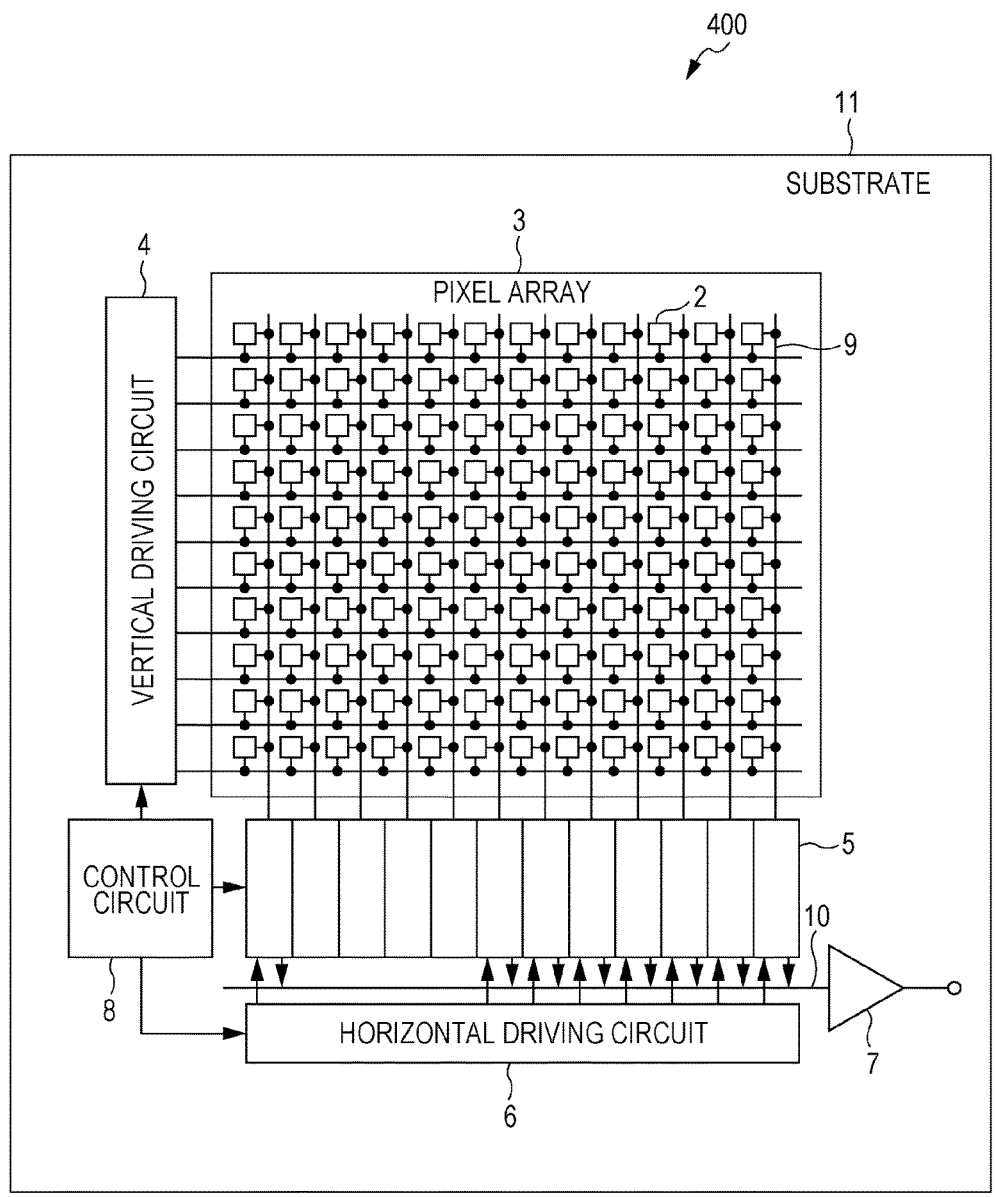
FIG. 19 is a view showing a solid-state imaging device according to a fourth embodiment.

FIG. 19 shows a schematic configuration of the solid-state imaging device 400 to which the semiconductor device 100 is applied. The solid-state imaging device 400 includes a pixel array 3 in which pixels 2 including a plurality of photoelectric conversion portions are regularly arranged in the form of a two-dimensional array on a semiconductor substrate 11, for example, formed of silicon, and a periphery circuit portion. The pixels 2 include, for example, photodiodes which are photoelectric conversion portions, and a plurality of pixel transistors. For example, a plurality of the pixel transistors include three transistors including a transfer transistor, a reset transistor, and an amplification transistor. In addition, a plurality of the pixel transistors may include four transistors adding a selection transistor to the three transistors. The pixel 2 may be configured by a single unit pixel. In general, since equivalent circuits of a unit pixel are similar to each other, the detailed description is omitted. In addition, the pixel 2 may be a shared pixel structure. The shared pixel structure is configured of a plurality of photodiodes, a plurality of transfer transistors, one floating diffusion which is shared, and another one pixel transistor which is supplied. That is, the shared pixel structure is configured so that photodiodes configuring a plurality of unit pixels and the transfer transistors are shared with the other one pixel transistor.

The periphery circuit portion includes a vertical driving circuit 4, a column signal processing circuit 5, a horizontal driving circuit 6, an output circuit 7, a control circuit 8, or the like.

The control circuit 8 receives data which directs an input clock, an operation mode, or the like, and outputs data such as internal information of the solid-state imaging device. That is, the control circuit 8 generates a clock signal or a control signal and the like which are references of operation of the vertical driving circuit 4, the column signal processing circuit 5, and the horizontal driving circuit 6 or the like based on a vertical synchronizing signal, a horizontal synchronizing signal, and a master clock. In addition, these signals are input to the vertical driving circuit 4, the column signal processing circuit 5, the horizontal driving circuit 6, or the like.

For example, the vertical driving circuit 4 includes shift registers and selects a pixel driving wiring. Further, the vertical driving circuit 4 supplies a pulse for driving the pixels to the selected pixel driving wiring and drives the pixels in units of a row. That is, the vertical driving circuit 4 selectively scans each pixel 2 of the pixel region 3 in units of a row in a sequentially vertical direction. In addition, the vertical driving circuit 4 supplies a pixel signal based on a signal charge to the column signal processing circuit 5 through a vertical signal line 9, and the signal charge is generated according to the amount of light received in, for example, the photodiode which becomes a photoelectric conversion portion of each pixel 2.

For example, the column signal processing circuit 5 is disposed at every column of the pixels 2, and performs signal processing such as noise removal of the signal output from the pixels 2 for one row at every pixel column. That is, the column signal processing circuit 5 performs signal processing such as CDS, signal amplification, or AD conversion for removing specific fixed pattern noise of the pixels 2. A horizontal selection switch (not shown) is connected and installed between horizontal signal lines 10 in the output end of the column signal processing circuit 5.

For example, the horizontal driving circuit 6 includes shift registers, sequentially selects each column signal processing circuit 5 by sequentially outputting a horizontal scan pulse, and outputs the pixel signal from each column signal processing circuit 5 to the horizontal signal line 10.

The output circuit 7 performs signal processing with respect to the signal which is sequentially supplied through the horizontal signal line 10 from each column signal processing circuit 5 and outputs the processed signal. For example, in the signal processing, only buffering may be performed, or a black level adjustment, a column deviation correction, and various digital signal processing, or the like may be performed.

Figure 20A:
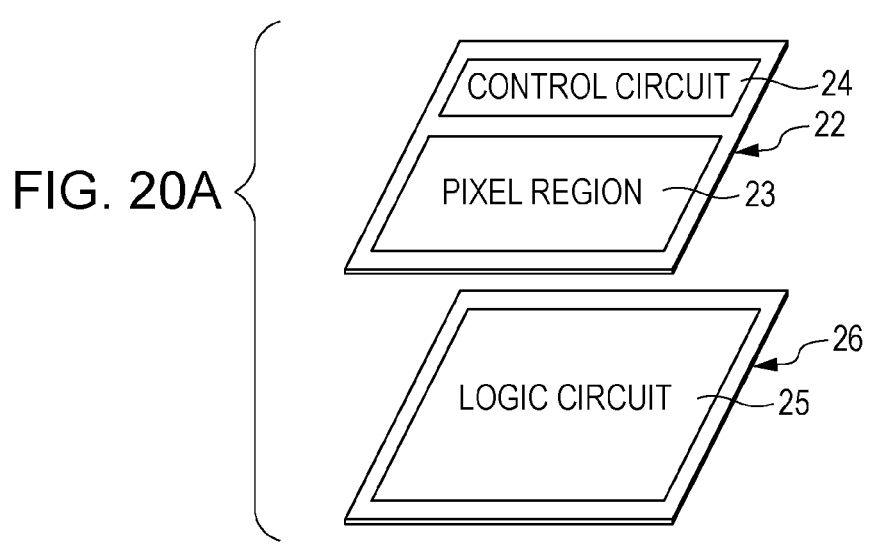
FIGS. 20A and 20B are views showing the solid-state imaging device according to the fourth embodiment.
Figure 20B:
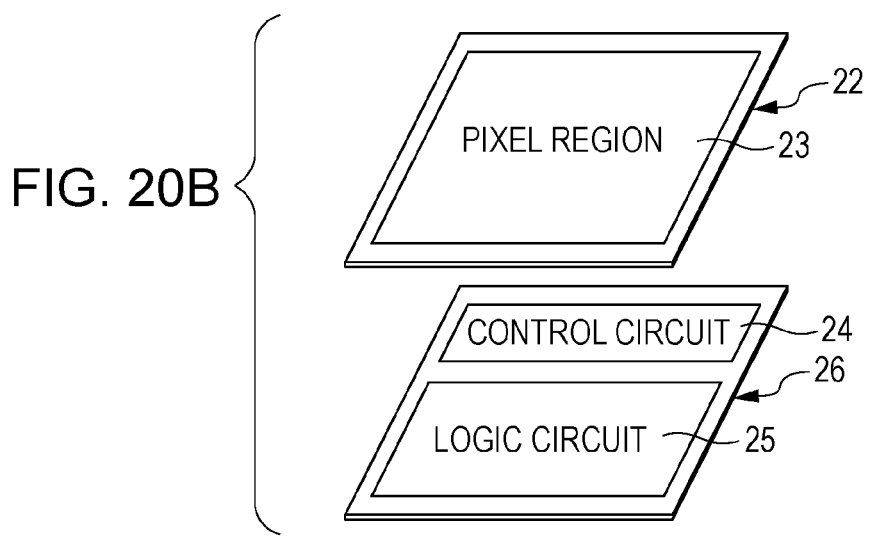

FIGS. 20A and 20B show a basic and schematic configuration of the solid-state imaging device 400 according to the embodiment. For example, as shown in FIG. 20A, in the solid-state imaging device 400, a pixel region 23 and a control circuit 24 are mounted on a first semiconductor chip 22, and a logic circuit 25 including a signal processing circuit for performing a signal processing is mounted on a second semiconductor chip 26. The first and the second semiconductor chips 22 and 26 are electrically connected to each other and configure the solid-state imaging device 400 as a single semiconductor device. For example, as another configuration example of the solid-state imaging device 400, there is a configuration of FIG. 20B. As shown in FIG. 20B, in the solid-state imaging device 400, the pixel region 23 is mounted on the first semiconductor chip 22, and the control circuit 24 and the logic circuit 25 including the signal processing circuit are mounted on the second semiconductor chip 26. The first and the second semiconductor chips 22 and 26 are electrically connected to each other and configure the solid-state imaging device 400 as a single semiconductor device.

Figure 21:
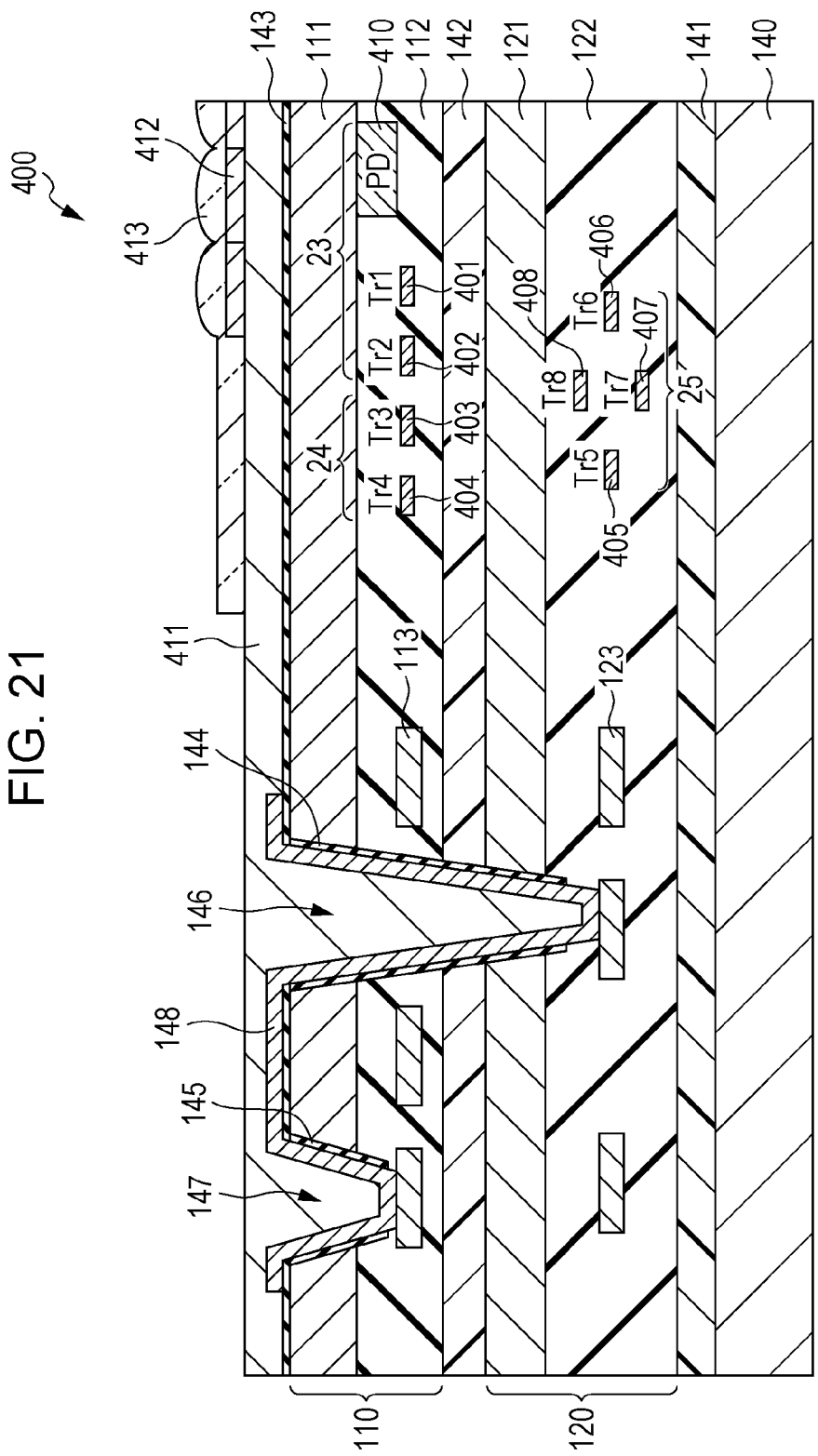
FIG. 21 is a view showing the solid-state imaging device according to the fourth embodiment.

FIG. 21 shows a cross-sectional view of the solid-state imaging device 400. As shown in FIG. 21, the pixel array (hereinafter, referred to as pixel region) 23 and the control circuit 24 are formed on the first semiconductor wafer 110. That is, a photodiode 410 which becomes the photoelectric conversion portion of each pixel 2 and the pixel array 23 including pixel transistors Tr1 and Tr2 are formed in the first insulating layer 112 of the first semiconductor wafer 110. The pixel transistors Tr1 and Tr2 include gate electrodes 401 and 402 and a source/drain region (not shown). The number of the pixel transistors may be 2 or more. Two pixel transistors Tr1 and Tr2 are shown on behalf of a plurality of pixel transistors. The pixel transistor Tr1 adjacent to the photodiode 410 corresponds to the transfer transistor and a source/drain region (not shown) of the pixel transistor Tr1 corresponds to the floating diffusion.

The control circuit 24 is configured by MOS transistors Tr3 and Tr4 which are formed in the first insulating layer 112 of the first semiconductor wafer 110. The MOS transistors Tr3 and Tr4 include gate electrodes 403 and 404 and a source/drain region (not shown). The number of the MOS transistors may be 2 or more. Two MOS transistors Tr3 and Tr4 are shown on behalf of a plurality of MOS transistors.

The logic circuit 25 including the signal processing circuit is formed in the second semiconductor wafer 120. That is, the logic circuit 25 including a plurality of MOS transistors Tr6 to Tr8 is formed in the second insulating layer 122 of the second semiconductor wafer 120. The MOS transistors Tr6 to Tr8 include gate electrodes 406 to 408 and a source/drain region (not shown). The number of the MOS transistors may be 3 or more. Three MOS transistors Tr6 to Tr8 are shown on behalf of a plurality of MOS transistors. Here, the MOS transistor is shown as the transistor configuring the logic circuit. However, a CMOS transistor may be configured as the transistor configuring the logic circuit.

The first wiring 113 and the second wiring 123 are electrically connected to each other by the first via 146, the second via 147, and the connection wiring 148. In addition, a planarized film 411 is formed on the third insulating layer 143. For example, on-chip color filters 412 of red (R), green (G), blue (B) corresponding to each pixel are formed on the planarized film 411, and on-chip microlenses 413 are formed on the on-chip color filters. Each of the on-chip color filters 412 and the on-chip microlenses 413 is formed corresponding to each unit pixel of the pixel array. Moreover, in FIG. 21, in order to facilitate the understanding of the embodiment, an enlarged cross-sectional configuration of the solid-state imaging device 400 except for the on-chip color filters 412 and the on-chip microlenses 413 is shown. Therefore, the pitch size of the on-chip color filters 412 and the on-chip microlenses 413 with respect to the pitch size of the unit pixel is scaled-down and shown.

Since the pixel array 23, the control circuit 24, and the logic circuit 25 can be manufactured by the similar method as that in the related art and the first via 146, the second via 147, and the connection wiring 148 can be manufactured by the same manufacturing method as that of the first embodiment, the detail descriptions are omitted.

As described above, the pixel array 23 and the control circuit 24 are formed in the first insulating layer 112 of the semiconductor device 100 shown in FIG. 1, the logic circuit 25 is formed in the second insulating layer 122, and therefore, the similar effects as those of the first embodiment can be obtained also from the solid-state imaging device 400. Since the semiconductor device 100 is applied to the solid-state imaging device 400, it is possible to mix the pixel array and the logic circuit by the wafer process technology in the related art.

Moreover, in the embodiment, the example in which the semiconductor device 100 of the first embodiment is applied to the solid-state imaging device 400 is described. However, the semiconductor devices shown in the first and the second modifications and the second and the third embodiments may be applied to the solid-state imaging device 400.

Fifth Embodiment

Figure 22:
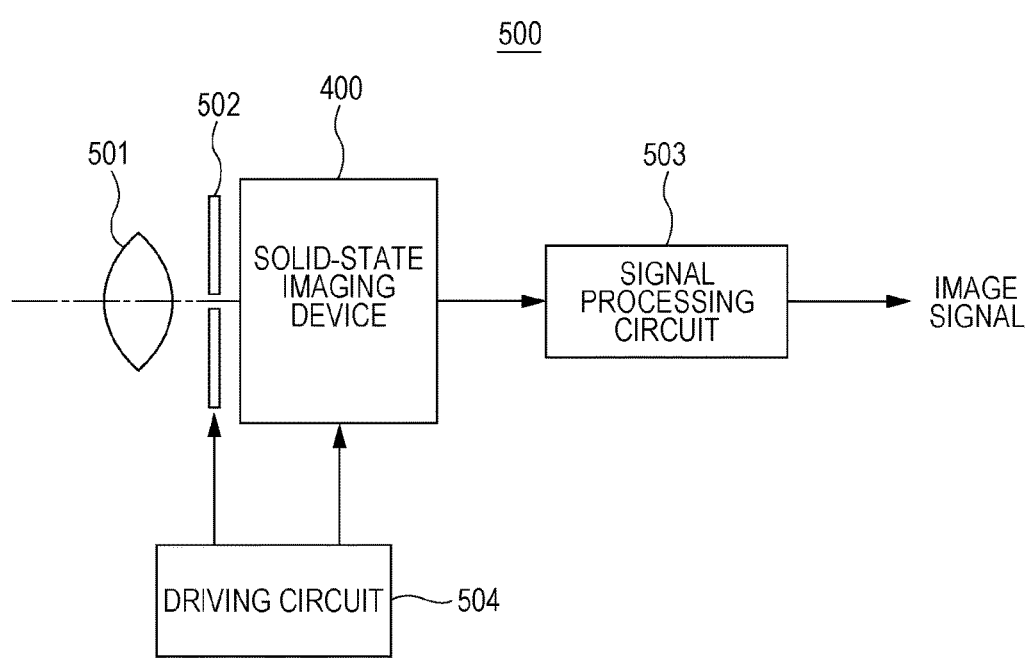
FIG. 22 is a view showing an electronic apparatus according to a fifth embodiment.

Next, in a fifth embodiment, an application of the solid-state imaging device 400 is described with reference to FIG. 22. FIG. 22 shows an example in which the solid-state imaging device 400 is applied to an electronic apparatus 500. For example, as the electronic apparatus 500, there are a digital camera, a camera in a cellular phone or the like, a scanner, a surveillance camera, and the like. However, here, a case where the electronic apparatus 500 is the digital camera is described.

The electronic apparatus 500 according to the embodiment of the present disclosure includes the solid-state imaging device 400, an optical lens 501, a shutter unit 502, a driving circuit 504, and a signal processing circuit 503.

The optical lens 501 images an image light (incident light) from an object on the imaging surface of the solid-state imaging device 400. Thereby, the signal charge is accumulated in the solid-state imaging device 400 for a predetermined interval.

The shutter unit 502 controls the light irradiation interval and the light shield interval into the solid-state imaging device 400. The driving circuit 504 supplies the driving signal which controls the transfer operation of the solid-state imaging device 400 and the shuttering operation of the shutter unit 402.

The solid-state imaging device 400 outputs the signal charge accumulated in the photoelectric conversion element 410 as the electric signal based on the driving signal.

The signal processing circuit 403 performs a variety of signal processings. The signal processing circuit 403 generates an image signal by performing signal processing with respect to the electric signal which is output from the solid-state imaging device 400, and outputs the generated signal to a recording medium such as memory (not shown), a monitor, or the like.

As described above, since the electric apparatus 500 according to the embodiment includes the solid-state imaging device 400 according to the fourth embodiment, the semiconductor wafers can be laminated while the influence on the substrate or the wiring due to etching is suppressed. Thereby, the solid-state imaging device in which the pixel array and the logic circuit can be mixed by the wafer process technology in the related art can be applied to the electronic apparatus.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a semiconductor device comprising:

laminating a first semiconductor wafer including a first substrate and a first insulating layer which is formed so as to come into contact with one surface of the first substrate, and a second semiconductor wafer including a second substrate and a second insulating layer which is formed so as to come into contact with one surface of the second substrate and bonding the first semiconductor wafer and the second semiconductor wafer to each other;

forming a third insulating layer on the other surface of a side opposite to the one surface of the first substrate; penetrating the third insulating layer, the first substrate, and the first insulating layer, performing etching so as that the second insulating layer remains on a second wiring layer which is formed in the second insulating layer, and forming a first connection hole;

forming an insulating film on the first connection hole; performing etching of the second insulating layer on the second wiring layer and the insulating film, forming a second connection hole, and exposing the second wiring layer; and forming a first via which is formed in inner portions of the first and the second connection holes and is connected to the second wiring layer, wherein a diameter of the first connection hole which is formed on the other surface of the first substrate is greater than a diameter of the first connection hole which is formed on the third insulating layer.

2. The method of manufacturing a semiconductor device according to claim 1, further comprising:
performing etching of the third insulating layer, the first substrate, and the first insulating layer so that the first insulating layer remains on a first wiring layer formed in the first insulating layer, and forming a third connection hole;
forming the insulating film on the third connection hole;
performing etching of the first insulating layer on the first wiring layer and the insulating film, forming a fourth connection hole, and exposing the first wiring layer; and
forming a second via which is formed in inner portions of the third and the fourth connection holes and is connected to the first wiring layer, wherein a diameter of the third connection hole which is formed on the other surface of the first substrate is greater than a diameter of the third connection hole which is formed on the third insulating layer, and a film thickness of the first insulating layer which remains on the first wiring layer is thinner than a film thickness of the second insulating layer which remains on the second wiring layer.

3. The method of manufacturing a semiconductor device according to claim 1, wherein the bonding of the first semiconductor wafer and the second semiconductor wafer includes bonding the first semiconductor wafer and the second semiconductor wafer through the first insulating layer and a connection layer which is connected to the second substrate.

4. The method of manufacturing a semiconductor device according to claim 1, wherein the bonding of the first semiconductor wafer and the second semiconductor wafer includes bonding the first semiconductor wafer and the second semiconductor wafer through a connection layer which connects the first insulating layer and the second insulating layer to each other.

5. A semiconductor device in which a first semiconductor wafer including a first substrate and a first insulating layer which is formed so as to come into contact with one surface of the first substrate, and a second semiconductor wafer including a second substrate and a second insulating layer which is formed so as to come into contact with one surface of the second substrate are laminated and bonded to each other, comprising:
a third insulating layer which is formed on the other surface of a side opposite to the one surface of the first substrate;
a first insulating film which is formed on a side wall of a portion of the first substrate, the first insulating layer, and the second insulating layer in an inner side of a first connection hole which penetrates the third insulating layer, the first substrate, and the first insulating layer and is formed on a portion of the second insulating layer; and
a first via which is formed in an inner side of the first connection hole on which the first insulating film is formed and in an inner side of a second connection hole which is formed so that a second wiring layer formed on the second insulating layer is exposed, and is connected to the second wiring layer, wherein a diameter of the first connection hole which is formed on the other surface of the first substrate is greater than a diameter of the first connection hole which is formed on the third insulating layer.

6. A solid-state imaging device in which a first semiconductor wafer including a first substrate, a first insulating layer which is formed so as to come into contact with one surface of the first substrate, and a pixel array portion, and a second semiconductor wafer including a second substrate, a second insulating layer which is formed so as to come into contact with one surface of the second substrate, and a wiring layer which is formed on the second insulating layer are laminated and bonded to each other, comprising:
a third insulating layer which is formed on the other surface of a side opposite to the one surface of the first substrate;
a first insulating film which is formed on a side wall of a portion of the first substrate, the first insulating layer, and the second insulating layer in an inner side of a first connection hole which penetrates the third insulating layer, the first substrate, and the first insulating layer and is formed on a portion of the second insulating layer; and
a first via which is formed in an inner side of the first connection hole on which the first insulating film is formed and in an inner side of a second connection hole which is formed so that a second wiring layer formed on the second insulating layer is exposed, and is connected to the second wiring layer, wherein a diameter of the first connection hole which is formed on the other surface of the first substrate is greater than a diameter of the first connection hole which is formed on the third insulating layer.

* * * * *